(12) United States Patent
Yamazaki et al.

(10) Patent No.: US 7,189,654 B2
(45) Date of Patent: Mar. 13, 2007

(54) MANUFACTURING METHOD FOR WIRING

(75) Inventors: Shunpei Yamazaki, Tokyo (JP); Hideaki Kuwabara, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 96 days.

(21) Appl. No.: 10/769,852

(22) Filed: Feb. 3, 2004

(65) Prior Publication Data

US 2005/0011752 A1    Jan. 20, 2005

(30) Foreign Application Priority Data

Feb. 5, 2003    (JP) .............................. 2003-028853
Feb. 5, 2003    (JP) .............................. 2003-028878

(51) Int. Cl.
*H01L 21/461* (2006.01)
*H01L 21/302* (2006.01)

(52) U.S. Cl. ...................... 438/706; 438/710; 438/714; 438/719; 438/720

(58) Field of Classification Search ..................... None
See application file for complete search history.

(56) References Cited

U.S. PATENT DOCUMENTS

| | | | |
|---|---|---|---|
| 5,429,994 A | * | 7/1995 | Ishikawa ..................... 438/676 |
| 5,483,082 A | | 1/1996 | Takizawa et al. |
| 5,549,780 A | * | 8/1996 | Koinuma et al. ...... 156/345.39 |
| 5,580,796 A | | 12/1996 | Takizawa et al. |
| 5,824,361 A | * | 10/1998 | Asanuma .................... 427/127 |
| 6,429,400 B1 | | 8/2002 | Sawada et al. |

(Continued)

FOREIGN PATENT DOCUMENTS

EP    1-340-838 A1    9/2003

(Continued)

OTHER PUBLICATIONS

Wolf et al., Silicon Processing for the VLSI Era, 1986, Lattice Press, vol. 1, pp. 198, 408, 427, 539, 542, 535.*

(Continued)

*Primary Examiner*—Duy-Vu N. Deo
(74) *Attorney, Agent, or Firm*—Nixon Peabody LLP; Jeffrey L. Costellia

(57) ABSTRACT

In the case in which a film for a resist is formed by spin coating, there is a resist material to be wasted, and the process of edge cleaning is added as required. Further, when a thin film is formed on a substrate using a vacuum apparatus, a special apparatus or equipment to evacuate the inside of a chamber vacuum is necessary, which increases manufacturing cost. The invention is characterized by including: a step of forming conductive layers on a substrate having a dielectric surface in a selective manner with a CVD method, an evaporation method, or a sputtering method; a step of discharging a compound to form resist masks so as to come into contact with the conductive layer; a step of etching the conductive layers with plasma generating means using the resist masks under the atmospheric pressure or a pressure close to the atmospheric pressure; and a step of ashing the resist masks with the plasma generating means under the atmospheric pressure or a pressure close to the atmospheric pressure. With the above-mentioned characteristics, efficiency in use of a material is improved, and a reduction in manufacturing cost is realized.

24 Claims, 23 Drawing Sheets

U.S. PATENT DOCUMENTS

| | | |
|---|---|---|
| 6,660,545 B2 | 12/2003 | Furusawa |
| 6,909,477 B1 | 6/2005 | Yi et al. |
| 2002/0109143 A1 | 8/2002 | Inoue |
| 2002/0128515 A1 | 9/2002 | Ishida et al. |
| 2002/0151171 A1 | 10/2002 | Furusawa |
| 2003/0054653 A1 | 3/2003 | Yamazaki et al. |
| 2003/0059975 A1 | 3/2003 | Sirringhaus et al. |
| 2003/0059984 A1 | 3/2003 | Sirringhaus et al. |
| 2003/0059987 A1 | 3/2003 | Sirringhaus et al. |
| 2003/0060038 A1 | 3/2003 | Sirringhaus et al. |
| 2003/0132987 A1 | 7/2003 | Ogawa |
| 2004/0075396 A1 | 4/2004 | Okumura et al. |
| 2004/0224433 A1 | 11/2004 | Yamazaki et al. |
| 2004/0253896 A1 | 12/2004 | Yamazaki |
| 2004/0266073 A1 | 12/2004 | Yamasaki |
| 2005/0011752 A1 | 1/2005 | Yamazaki et al. |
| 2005/0013927 A1 | 1/2005 | Yamazaki |
| 2005/0064091 A1 | 3/2005 | Yamazaki |
| 2005/0090029 A1 | 4/2005 | Yamazaki et al. |
| 2005/0167404 A1 | 8/2005 | Yamazaki et al. |

FOREIGN PATENT DOCUMENTS

| | | |
|---|---|---|
| JP | 06-202153 | 7/1994 |
| JP | 07-024579 | 1/1995 |
| JP | 09-320363 | 12/1997 |
| JP | 11-340129 | 12/1999 |
| JP | 11-340129 A | 12/1999 |
| JP | 2000-169977 | 6/2000 |
| JP | 2001-068827 | 3/2001 |
| JP | 2001-093871 | 4/2001 |
| JP | 2001-179167 | 7/2001 |
| JP | 2002-066391 | 3/2002 |
| JP | 2002-151478 A | 5/2002 |
| JP | 2002-27480 A | 8/2002 |
| JP | 2002-237463 | 8/2002 |
| JP | 2002-237480 | 8/2002 |
| JP | 2002-289864 | 10/2002 |
| JP | 2002-324966 | 11/2002 |
| JP | 2002-359246 | 12/2002 |
| JP | 2002-359347 | 12/2002 |
| JP | 2003-017413 | 1/2003 |
| JP | 2003-311197 | 11/2003 |
| JP | 2003-347284 | 12/2003 |
| WO | WO-01-47044 | 6/2001 |
| WO | WO-02-40742 | 5/2002 |
| WO | WO-2004/070809 | 8/2004 |
| WO | WO-2004/070810 | 8/2004 |
| WO | WO-2004-070811 | 8/2004 |
| WO | WO-2004-070819 | 8/2004 |
| WO | WO-2004/070820 A1 | 8/2004 |
| WO | WO-2004-070821 | 8/2004 |
| WO | WO-2004-070822 | 8/2004 |
| WO | WO-2004-070823 | 8/2004 |

OTHER PUBLICATIONS

International Search Report (Application No. PCT/JP2004/000897) and Written Opinion dated Apr. 27, 2004 with partial translation of Written Opinion.
International Search Report (Application No. PCT/JP2004/000899) and Written Opinion dated Apr. 27, 2004 with partial translation of Written Opinion.
International Search Report (Application No. PCT/JP2004/000900) and Written Opinion dated Jun. 1, 2004 with partial translation of Written Opinion.
International Search Report (Application No. PCT/JP2004/000915) and Written Opinion dated Apr. 27, 2004 with partial translation of Written Opinion.
International Search Report (Application No. PCT/JP2004/000918) and Written Opinion dated Apr. 27, 2004 with partial translation of Written Opinion.
International Search Report (Application No. PCT/JP2004/000930) and Written Opinion dated Apr. 13, 2004 with partial translation of Written Opinion.
International Search Report (Application No. PCT/JP2004/000932) and Written Opinion dated Apr. 6, 2004 with partial translation of Written Opinion.
International Search Report (Application No. PCT/JP2004/000897) Dated Apr. 27, 2004 (In Japanese).
Written Opinion (Application No. PCT/JP2004/000897) Dated Apr. 27, 2004.
International Search Report (Application No. PCT/JP2004/000899) dated Apr. 27, 2004 with Partial Translation.
International Search Report (Application No. PCT/JP2004/000900) and Written Opinion dated Jun. 1, 2004 with Partial Translation.
International Search Report (Application No. PCT/JP2004/000932) dated Apr. 6, 2004 with Partial English Translation.
International Search Report (Application No. PCT/JP2004/000895) and Written Opinion dated Apr. 27, 2004 with Partial Translation.

* cited by examiner

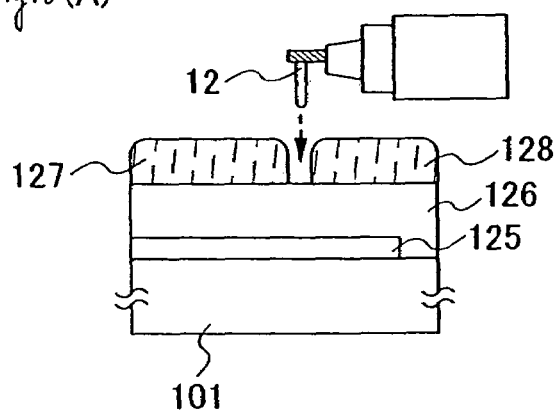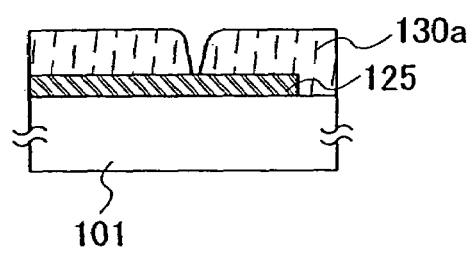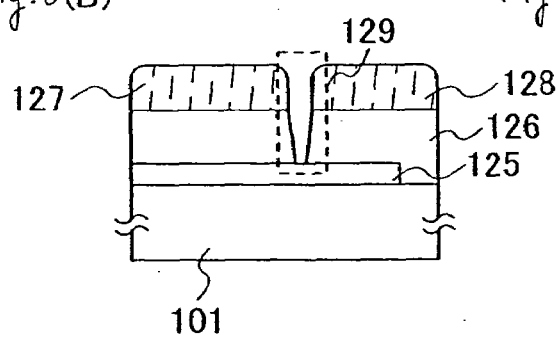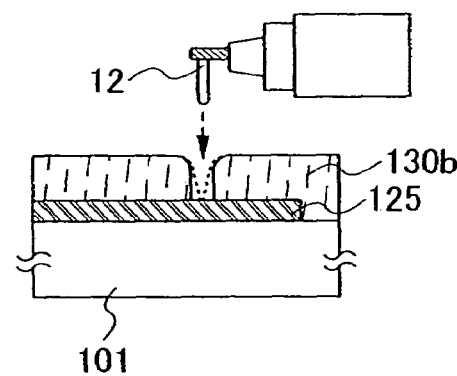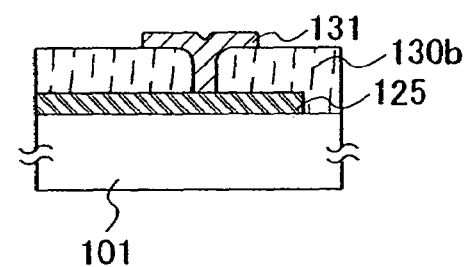

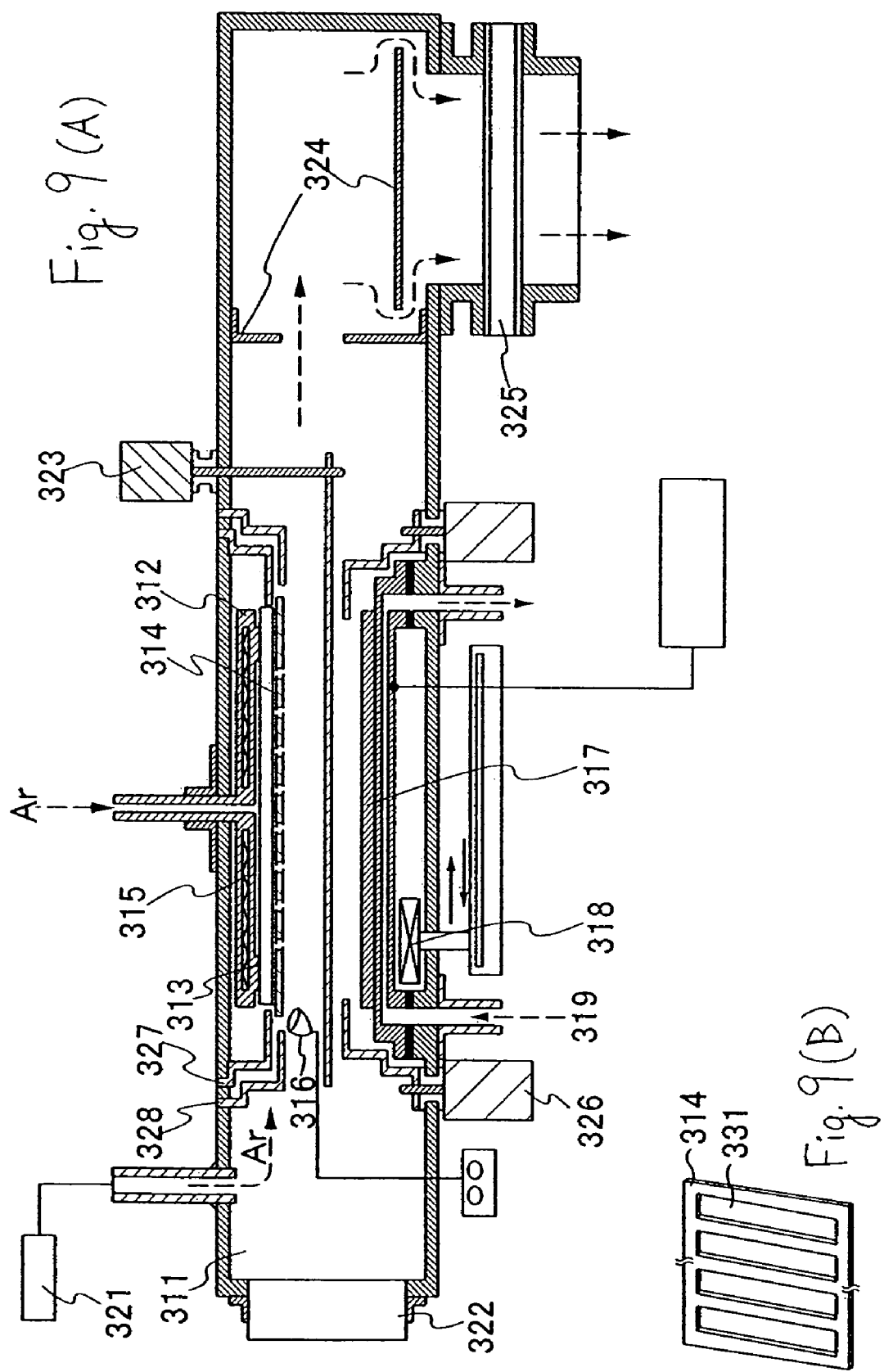

PIXEL PORTION

MANUFACTURING METHOD FOR WIRING

BACKGROUND OF THE INVENTION

1. Field of the Invention

The present invention relates to a manufacturing method for wiring, a contact hole, and a display apparatus, and more specifically, to a manufacturing method for wiring, a contact hole, and a display apparatus that uses any one of a manufacturing method for a thin film such as a registration pattern using an ink droplet jet method (an ink jet method, an ink droplet discharge method), a manufacturing method for a thin film by a CVD (chemical vapor deposition) method, an evaporation method, or a sputtering method, and a local etching treatment method or ashing treatment method that is performed under the atmospheric pressure or a pressure close to the atmospheric pressure. In addition, the invention relates to a semiconductor manufacturing apparatus for forming a thin film.

2. Background Art

A thin film transistor (TFT), which is formed using a thin film on an insulating surface, is widely applied for an integrated circuit and the like and is used as a switching element in many cases. Among the applications, since the application of a display panel using the TFT has been extended to, in particular, a large display apparatus, demands for high definition, a high aperture ratio, high reliability, and an increase in size of a screen have been increasing.

As a manufacturing method for wiring in such a thin film transistor, there is a method of forming a film of a conductive layer on an entire surface of a substrate and, thereafter, performing etching treatment using a mask. In addition, a lithography technique for forming a film of a photosensitive resin (photoresist) on a substrate and performing exposure and development using a mask, on which a pattern is drawn, and an ultraviolet ray. A resist pattern formed by this technique is used as a mask in performing etching treatment, as provided in JP-A-2002-359246.

In addition, in recent years, spread of a liquid crystal television that realizes a reduction in thickness and weight, which is not realized by a CRT television, has been advanced. In realizing an increase in an added value for the liquid crystal television, a screen size is an important element. According to a composition ratio by inch in the present situation, a screen size of 20 inches or less occupies about 70% of the market. On the other hand, large liquid crystal televisions of 20 inches or more, for example, 40 inches have appeared.

Such an increase in a screen size has accelerated an increase in a substrate size, transmission has progressed to a fourth generation (680×880, 730×920) and a fifth generation (1000×1200), and high definition has also progressed with a resolution thereof at VGA (640×RGB×480), SVGA (800×RGB×600), XGA (1024×RGB×768), and SXGA (1280×RGB×1024).

A film of a resist is often formed using a spin coater that drips liquid of the resist and rotates (spins) a substrate to manufacture the film with a centrifugal force of it. In this case, about 95% of the dripped resist scatters at the time of spin coating. Thus, it has been attempted to devise a material for the resist, a rotation speed of the spin, and a way of rotation. However, despite the attempt, about 90% of the resist is wasted. In the case in which a large substrate is used, such a problem is particularly serious.

In addition, when the spin coating is performed, the resist is coated up to the ends of the substrate. Then, the resist at the ends is scraped off and adheres to the substrate at the time of handling the substrate, which leads to a pattern defect. Therefore, a process of edge cleaning for removing the resist at the ends by an organic solvent is required. In other words, in the case in which the film of the resist is formed by the spin coating, there is a resist material to be wasted, and the process of edge cleaning is added as required.

Further, when a thin film is formed on a substrate using a vacuum apparatus, a special apparatus or equipment for making the inside of a chamber vacuum is necessary, which increases manufacturing cost. In the case in which a large substrate is used, since a size of the chamber is also increased inevitably, long treatment time is required to evacuate the inside of the chamber, and a large quantity of a film formation gas is also required.

SUMMARY OF THE INVENTION

The present invention has been devised in view of such problems, and it is an object of the invention to provide a manufacturing method for wiring, a contact hole, and a display apparatus with a purpose of improving a through put and an efficiency in use of a material to reduce manufacturing cost by using an ink droplet jet method. In addition, it is an object of the invention to provide a manufacturing method for wiring, a contact hole, and a display apparatus, which can cope with an increase in size of a substrate, by using the plasma treatment method under the atmospheric pressure or a pressure close to the atmospheric pressure.

Moreover, it is an object of the invention to provide a semiconductor manufacturing apparatus that is capable of realizing a manufacturing method for wiring, a contact hole, and a display apparatus that solves the above-mentioned problems.

In order to solve the problems of the conventional technique, the following means is taken in the invention.

The invention is a manufacturing method for wiring that forms a conductive layer on a substrate having an insulating surface by a CVD method, an evaporation method, or a sputtering method, forms a resist pattern, which is in contact with the conductive layer, using a head for jetting a composition containing a photosensitive agent, and after applying etching treatment to the conductive layer with the resist pattern as a mask, applies ashing treatment to the resist pattern, characterized in that the resist pattern is formed by scanning the head or the substrate, and the etching treatment or the ashing treatment is performed by moving plural plasma generating means for scanning, which are arranged linearly, under the atmospheric pressure or a pressure close to the atmospheric pressure.

The invention is a manufacturing method for a contact hole that forms a semiconductor layer or a conductive layer on a substrate having an insulating surface by a CVD method, an evaporation method, or a sputtering method, forms an insulated layer on the semiconductor layer or the conductive layer, and applies etching treatment to the insulated layer to form a contact hole that reaches the semiconductor layer or the conductive layer, characterized in that the etching treatment is performed by moving plural plasma generating means for scanning, which are arranged linearly, under the atmospheric pressure or a pressure close to the atmospheric pressure.

The invention is characterized in that a display apparatus is manufactured using one or both of the above-mentioned manufacturing method for wiring and the manufacturing method for a contact hole. Examples of the display apparatus include any display apparatus using a thin film technique, for example, a liquid crystal display apparatus using a liquid crystal element and a light emitting apparatus using a selfluminous element.

The invention is a semiconductor manufacturing apparatus that includes forming means that forms a conductive layer on a substrate having an insulating surface by a CVD method, an evaporation method, or a sputtering method, ink droplet jetting means that forms a resist pattern using a head for jetting a composition containing a photosensitive agent, a moving means which moves the substrate and the head, and plural plasma generating means, which perform etching treatment or ashing treatment, under the atmospheric pressure or a pressure close to the atmospheric pressure, characterized in that the plural plasma generating means are arranged linearly.

It is characterized in that the conductive layer or the semiconductor layer is formed by the CVD method, the evaporation method, or the sputtering method, and preferably, formed in a selective manner. Specifically, the semiconductor manufacturing apparatus does not form a film on an entire surface of a substrate but forms a film only in a desired place in a selective manner by using a mask (metal mask). For example, with the evaporation method, the semiconductor manufacturing apparatus does not form a film on an entire surface of a substrate but forms a film only in a desired place in a selective manner by narrowing a supply port for supplying an evaporation source and performing scanning.

The formation of the resist pattern is characterized in that using the head for jetting a composition containing a photosensitive agent. This is a so-called ink droplet jet method (ink jet method) is used, and is performed by scanning the head or the substrate. With this structure, compared with the case in which a resist pattern is manufactured using spin coating, efficiency in use of a resist material is improved remarkably, which leads to a reduction in manufacturing cost. In addition, since it is possible to scan one or both of the head and the substrate, accuracy is improved, and a film can be formed only in a desired place.

The etching treatment or the ashing treatment is characterized in that scanning the plural plasma generating means, which are arranged linearly, under the atmospheric pressure or a pressure close to the atmospheric pressure. Since vacuum equipment is not required for the treatment, improvement of productivity and a reduction in manufacturing cost are made possible. In addition, by using the plural plasma generating means arranged linearly, it become advantageous in terms of tact time. Preferably, if the plural plasma generating means are arranged linearly so as to have the same length as one side of the substrate, the treatment can be finished by performing scanning once. Note that a scanning direction is not limited to a direction parallel to the one side of the substrate, and the scanning may be performed in an oblique direction.

In addition, it is unnecessary to supply a reactant gas from all the plasma generating means among the plural plasma generating means arranged linearly, and the treatment can be performed if a predetermined gas flow is supplied only to a target point. Therefore, the invention, with which it is unnecessary to always supply a reactant gas, leads to gas saving and makes it possible to reduce manufacturing cost.

Further, the manufacturing method for a contact hole is characterized in that plasma is generated only in one or more selected out of the plural plasma supplying means. In other words, setting is made to make the plural plasma generating means, which are arranged linearly, relatively scan the substrate and to supply a reactant gas only to a desired place where it is desired to form a contact hole. The invention having such a structure improves use efficiency of a gas compared with the case in which a reactant gas is supplied to the entire surface, and leads to a reduction in manufacturing cost.

The invention having the above-mentioned structure can provide a manufacturing method for wiring, a contact hole, and a display apparatus that can realize a reduction in space and efficiency of a manufacturing line, contribute to significant improvement of quality, improvement of productivity, and a reduction in manufacturing cost in manufacturing of a display panel, and be better for the earth environment. In addition, since an atmospheric pressure system capable of performing in-line treatment linked to production is adopted, high-speed and consecutive treatment is possible. Moreover, since only a necessary quantity of material has to be used in a desired place, waste of materials becomes a little. Thus, improvement in efficiency in use of materials and a reduction in manufacturing cost are realized.

The invention is a manufacturing method for wiring that forms a resist pattern, which is in contact with a conductive layer on a substrate, using a head for jetting a composition containing a photosensitive agent, and after applying etching treatment to the conductive layer with the resist pattern as a mask, applies ashing treatment to the resist pattern, characterized in that the conductive layer is formed by a CVD method, a sputtering method, or an evaporation method, the resist pattern is formed by moving the head or the substrate, and the etching treatment or the ashing treatment is performed using plasma generating means under the atmospheric pressure or a pressure close to the atmospheric pressure.

The invention is characterized in that a display apparatus is manufactured using the above-mentioned manufacturing method for wiring. Examples of the display apparatus include any display apparatus using a thin film technique, for example, a liquid crystal display apparatus using a liquid crystal element and a light-emitting apparatus using a self-luminous element.

The invention having the above-mentioned structure can provide a manufacturing method for wiring, a contact hole, and a display apparatus that can realize a reduction in space and efficiency of a manufacturing line, contribute to significant improvement of quality, improvement of productivity, and reduction in manufacturing cost in manufacturing of a display panel, and be better for the earth environment. In addition, since an atmospheric pressure system capable of performing in-line treatment linked to production is adopted, high-speed and consecutive treatment is possible. Moreover, since only a necessary quantity of material has to be used in a desired place, waste of materials becomes a little. Thus, improvement in efficiency in use of materials and a reduction in manufacturing cost are realized.

BRIEF DESCRIPTION OF THE DRAWINGS

FIGS. 6(A) to 6(E) illustrate a manufacturing method for a contact hole.

FIGS. 9(A) and 9(B) illustrate a sputtering apparatus.

DETAILED DESCRIPTION OF THE INVENTION

Figure 1:
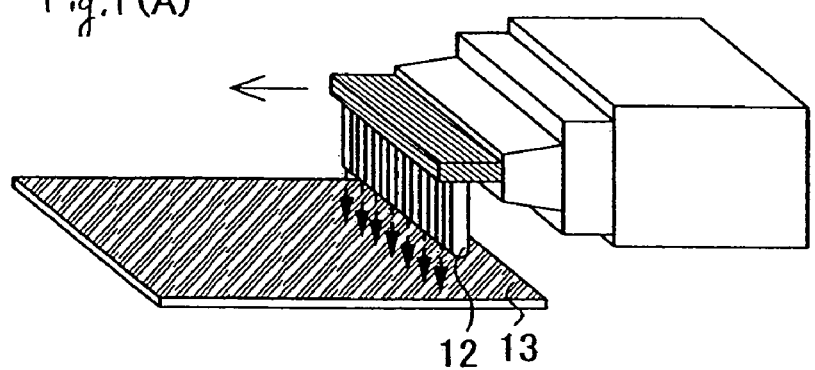
FIGS. 1(A) to 1(D) show a plasma treatment apparatus.
Figure 1:
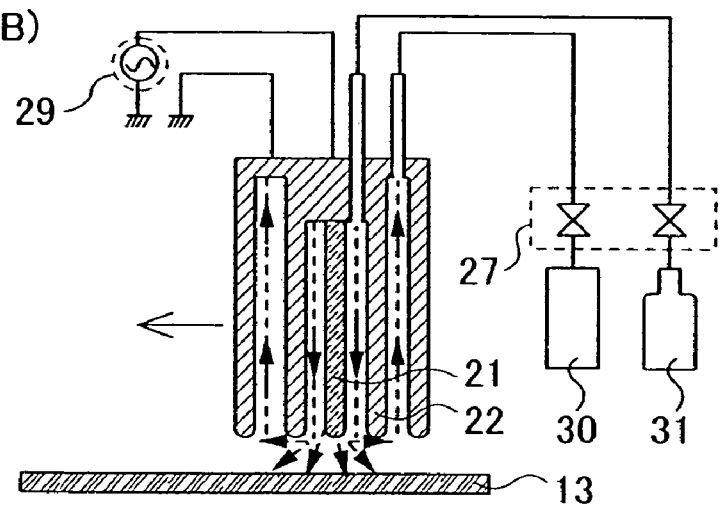
Figure 1:
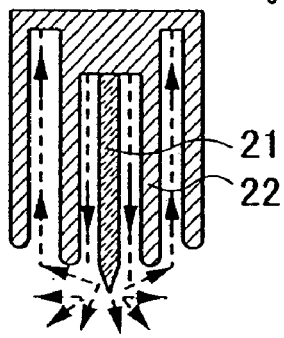
Figure 1:
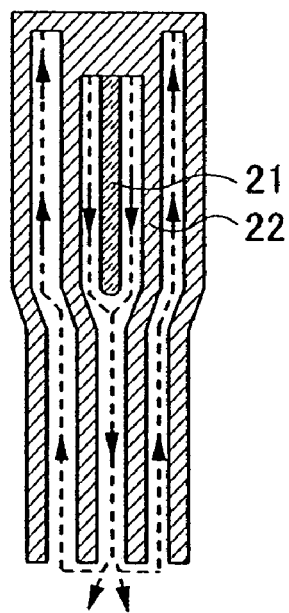

Embodiment modes of the present invention will be explained in detail using the drawings. However, the invention is not limited to the following explanation, those skilled in the art will easily understand that a form and details of the invention can be changed in various ways without departing from the spirit and scope of the invention. Therefore, the invention is not interpreted with limitation to describe contents of the embodiment mode indicated below. Note that, in a constitution of the invention explained below, reference numerals and signs denoting same components are commonly used among different drawings.

(Embodiment Mode 1)

First, as a characteristic of the invention, plasma generating means, in which plural electrodes are arranged linearly, is used for scanning to perform etching treatment or ashing treatment under the atmospheric pressure or a pressure close to the atmospheric pressure ($6.6 \times 10^2$–$1.1 \times 10^5$ Pa). Thus, using FIGS. 1 and 2, an apparatus having plural cylindrical electrodes, in which a first electrode surrounds a second electrode and have nozzle-like narrow ports at tips thereof, will be explained as an example of a plasma treatment apparatus used in the present invention.

Figure 2A:
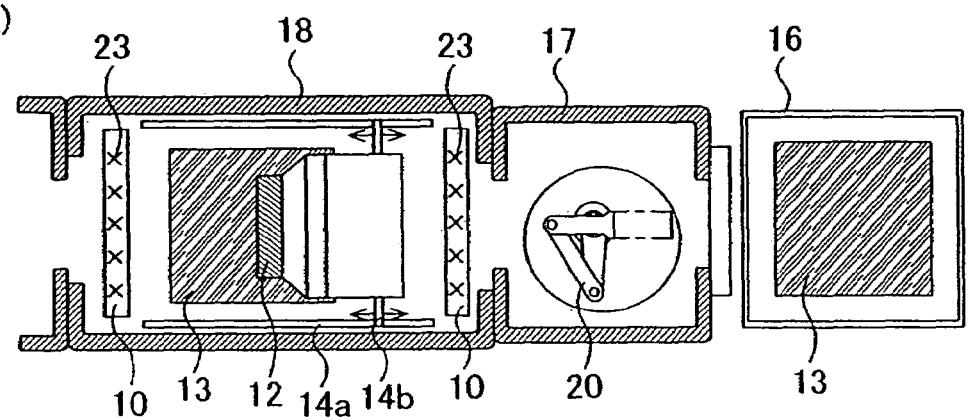
FIGS. 2(A) to 2(B) show the plasma treatment apparatus.
Figure 2B:
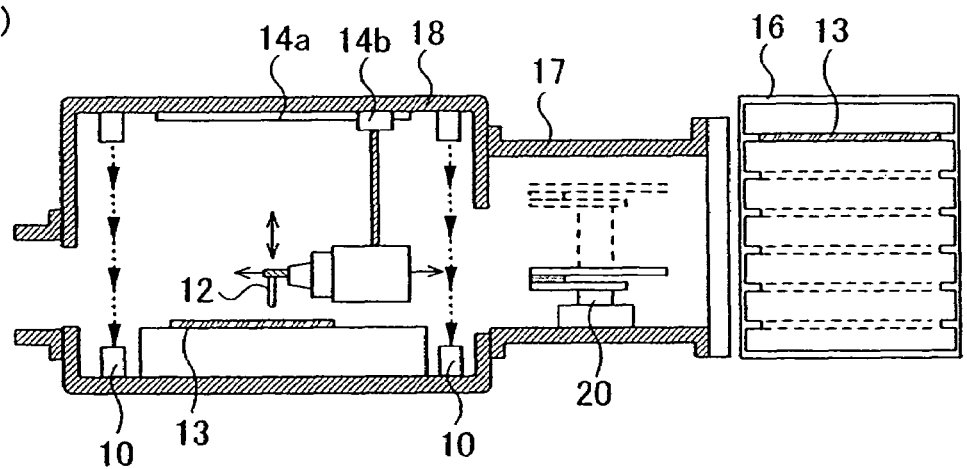

FIG. 2(A) is a top view of the apparatus, and FIG. 2(B) is a sectional view of the apparatus. In the figures, an object to be treated 13 such as a glass substrate and a resin substrate, which is represented by a plastic substrate with a desired size, is set in a cassette chamber 16. As a conveying system for the representative object to be treated 13, there is horizontal conveyance. However, in the case in which a substrate of a fifth generation or later, which is the representative object to be treated 13, is used, vertical conveyance with the substrate placed vertically may be performed for the purpose of reducing an area occupied by a conveyor.

In a conveyance chamber 17, the object to be treated 13 arranged in the cassette chamber 16 is conveyed to a plasma treatment chamber 18 by a conveyance mechanism (robot arm) 20. In the plasma treatment chamber 18 adjacent to the conveyance chamber 17, airflow control means 10, plasma generating means 12 in which plural cylindrical electrodes are arranged linearly, rails 14a and 14b for moving the plasma generating means 12, and the like are provided. In addition, publicly-known heating means (not shown) such as a lamp is provided as required.

The airflow control means 10 is provided for the purpose of protection against dusts and performs control of an airflow using an inert gas jetted out from a blowout port 23 for a gas such that the apparatus is shut off from the external air. The plasma generating means 12 moves to a predetermined position with the rail 14a arranged in a conveying direction of the object to be treated 13 and the rail 14b arranged in a direction perpendicular to the conveying direction.

Now, details of the plasma generating means 12 will be explained using FIG. 1. FIG. 1(A) shows a perspective view of the plasma generating means 12, in which the plural cylindrical electrodes are arranged linearly, and FIGS. 1(B) to (D) show sectional views of the cylindrical electrodes.

In FIG. 1(B), dotted lines indicate paths of a gas, and reference numerals 21 and 22 denote electrodes consisting of metal having conductivity such as aluminum or copper. A first electrode 21 is connected to a power supply (high-frequency power supply) 29. Note that a cooling system (not shown) for circulating cooling water may be connected to the first electrode 21. When the cooling system is provided, heating in the case of performing surface treatment successively is prevented by circulation of the cooling water to make it possible to improve efficiency by successive treatment. The second electrode 22 has a shape surrounding the periphery of the first electrode 21 and is grounded electrically. Then, the first electrode 21 and the second electrode 22 have a cylindrical shape with nozzle-like narrow ports for a gas at tips thereof.

Note that it is advisable to cover one or both of the first electrode 21 and the second electrode 22 with a solid dielectric. Examples of the solid dielectric include metal oxides such as aluminum oxide, zirconium dioxide, and titanium dioxide, organic materials such as polyethylene terephthalate and polytetrafluoro-ethylene, and oxides such as silicon oxide, glass, and barium titanate. The solid dielectric may be of sheet-like or film-like, but it is preferable that thickness of the dielectric is 0.05 to 4 mm. This is because, since a high voltage is required to generate discharge plasma, if the solid dielectric is too thin, dielectric breakdown occurs at the time of voltage application to cause arc discharge.

A process gas is supplied to a space between the first electrode 21 and the second electrode 22 by gas supplying means (gas cylinder) 31 via a valve 27. Then, the atmosphere in this space is replaced, and when a high-frequency voltage (e.g., 10 to 500 MHz) is applied to the first electrode 21 by the high-frequency power supply 29 in this state, plasma is generated in the space. Then, when a reactive gas flow, which contains chemically active excited species such as ion and radical generated by this plasma, is irradiated toward the surface of the object to be treated 13, predetermined surface treatment can be performed on the surface of the object to be treated 13. Note that the process gas to be filled in the gas supplying means (gas cylinder) 31 is appropriately selected according to a type of surface treatment to be performed in the treatment chamber. In addition, an exhaust gas is introduced into an exhaust system 31 via the valve 27. Note that this exhaust gas may be passed through a filter to remove mixed dusts and refine the exhaust gas for recycling. By performing recycling in this way, use efficiency of a gas can be further improved.

Next, the cylindrical plasma generating means 12 with different sections will be explained using FIGS. 1(C) and (D). FIG. 1(C) shows the plasma generating means 12 in which the first electrode 21 is longer than the second electrode 22 and the first electrode 21 has an acute-angled shape. In addition, FIG. 1(D) shows the plasma generating means 12 that has a shape for jetting an ionized gas flow that occurs between the first electrode 21 and the second electrode 22. In this way, the shape of plasma generating means is not specifically limited but may have any shape.

In the invention using the plasma treatment apparatus that is operated under the atmospheric pressure or a pressure close to the atmospheric pressure, time for vacuuming and air opening necessary for a decompression device is not required, and it is unnecessary to arrange a complicated vacuum system. In particular, in the case in which a large substrate is used, a chamber is also increased in size inevitably, and long treatment time is required if the inside of the chamber is brought into a decompressed state. Therefore, the invention using this apparatus, which is operated under the atmospheric pressure or a pressure close to the atmospheric pressure is effective and it is possible to reduce manufacturing cost.

The apparatus having a characteristic in using the plasma generating means 12 in which the plural cylindrical electrodes are arranged linearly can perform plasma treatment by performing scanning only once. Thus, the apparatus is particularly effective for a large substrate. Moreover, the apparatus only has to perform the treatment only for a necessary place and stop supply of a gas in an unnecessary place by scanning with the plasma generating means 12. Thus, efficiency of use of a gas to be used is improved to make it possible to reduce manufacturing cost.

In other words, the plasma treatment apparatus used in the invention scans the object to be treated 13 or the plasma generating means 12 while maintaining a distance between the object to be treated 13 and the plasma generating means 12 constant and applies plasma treatment to the surface of the object to be treated 13. Therefore, the invention using the plasma generating means 12 in which the plural cylindrical electrodes are arranged in one axial direction can reduce the number of times of scanning the object to be treated 13 or the plasma generating means 12. Thus, it is effective in the case in which a large substrate is used as the object to be treated 13.

In the case in which etching treatment is applied to the surface of the object to be treated 13 using the above apparatus, the etching treatment is performed by supplying a material gas of $NF_3$, $CF_4$ (carbon tetrafluoride), $SF_6$, or $Co_x$, and a mixed gas of one of hydrogen and oxygen and a rare gas to the plasma generating means 12 from the gas supplying means 31 to generate plasma. For example, fluorine atoms are generated using a material gas of $NF_3$ or $SF_6$, and the fluorine atoms react with solid silicon to be vaporized as a volatile $SiF_4$ gas and exhausted to the outside, whereby the etching treatment is performed. In addition, in the case in which ashing treatment is applied to the surface of the object to be treated 13, the ashing treatment is performed by supplying a material gas of oxygen and one of hydrogen, $CF_4$, $NF_3$, $H_2O$, and $CHF_3$ to the plasma generating means 12 from the gas supplying means 31 to generate plasma. For example, the ashing treatment for a photosensitive organic resist is performed by introducing oxygen and carbon tetrafluoride and changing into $CO_2$, CO, and $H_2O$ to exfoliate the resist.

Note that formation of a thin film by the plasma CVD method may be performed, and formation of not only an insulating film but also a conductive film of metal or the like may be performed using the above apparatus. In addition, cleaning treatment for components may be performed, and in particular, cleaning treatment for the electrodes 21 and 22 may be performed with plasma using a gas of $NF_3$, $CF_4$ (carbon tetrafluoride), $SF_6$, $Co_x$, or the like, and $O_2$, in the case of an organic material.

In addition, the invention is characterized in that a resist pattern is formed by the ink droplet jet method. More specifically, a resist pattern, which is in contact with the conductive layer, is formed using one head for jetting a compound containing a photosensitive agent. In this case, the invention is characterized in that the resist pattern is formed by moving the head or a substrate for scanning. Thus, the manufacturing method for wiring of the invention using the plasma treatment method, which is performed under the atmospheric pressure or a pressure close to the atmospheric pressure, and this ink droplet jet method will be hereinafter explained.

Figure 3A:
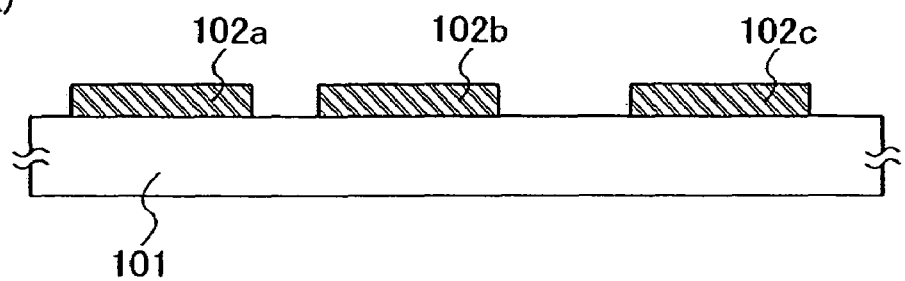
FIGS. 3(A) to 3(C) illustrate an ink droplet jet method.

First, a material such as glass, quartz, a semiconductor, plastics, a plastic film, metal, glass epoxy resin, or ceramics is formed as a substrate 101 (FIG. 3(A)). As a material for the substrate 101, any material may be used as long as the material can withstand treatment temperature in a manufacturing process of the invention.

Subsequently, conductive films 102a to 102c (hereinafter generally referred to as conductive films 102) are formed on the substrate 101 in a selective manner. Note that, although a state in which a base film has already been formed on the substrate 101 or a state in which a semiconductor element such as a transistor and an insulating film have already been formed may be acceptable, it is assumed here that the conductive films 102 are formed on the substrate 101 for convenience of explanation.

Further, the invention is characterized by performing formation of the conductive films 102 by the CVD method, the evaporation method, or the sputtering method in a selective manner. In other words, the present invention is characterized in that, conductive films are formed only in places, where wiring is formed later, in a selective manner, not forming the conductive films 102 on the entire surface of the substrate 101. In the invention having the above-mentioned structure, use efficiency of a material used as wiring is improved, which makes it possible to reduce manufacturing cost.

In the case in which the conductive films 12 are formed by the CVD method, a source gas, a reaction temperature, and a reaction pressure are set appropriately. For example, in the case in which a tungsten (W) film is formed, $WF_6$ is used as the source gas, and the reaction temperature is set to 200 to 500° C. In addition, in the case in which an aluminum (Al) film is formed, a method of decomposing an organic compound at relatively low temperature is mainly adopted. $(C_4H_9)_3Al$ is used as the source gas, the reaction temperature is set to 250 to 270° C., and temperature of a gas is thermally activated in a course of introduction to form the film. In addition, in the case in which a copper (Cu) film is formed, an organic compound containing copper is used as the source gas, and the reaction temperature is set to 100 to 300° C. to form the film with thermal decomposition. Note that, since it is necessary to form a film under decompression depending upon a type of a thin film to be formed, the reaction pressure is set to a predetermined pressure in that case.

In the case in which the conductive films 102 are formed by the evaporation method, examples of a representative source include electrification heating, an electron beam, a hollow cathode, and laser ablation. However, it is likely that composition change occurs in the methods other than the laser ablation. Therefore, in order to form an alloy film, it is advisable to use a method such as a flash evaporation method that granulates the alloy material and evaporates each granule instantaneously. In the case in which the conductive films 102 are formed by the evaporation method in a selective manner, a supply port of an evaporation source is reduced, and the evaporation source or a substrate is moved for scanning.

In the case in which the conductive films 102 are formed by the sputtering method, a system according to contrivance of an electrode such as bipolar sputtering or magnetron sputtering or a system according to contrivance of an operation method for sputtering such as high-frequency sputtering may be used. As a method of forming the conductive films 102 with the sputtering method in a selective manner, referring to the dipole sputtering as an example, there is a method of adopting a structure in which two electrodes are set vertically and a square plate-like target is placed between the two electrodes. In this case, by setting an area of target itself, which is opposed to an object to be treated, small, the conductive films 102 can be formed in a selective manner.

Note that, although the case in which conductive films are formed in a selective manner is described in the above-mentioned three methods, the invention is not limited to this. Conductive films may be formed in a selective manner by using a metal mask together with the method of forming conductive films over the entire surface. In this case, although efficiency in use of a material for wiring is not improved, it is unnecessary to apply etching treatment to all places of a thin film other than a place coated with a resist pattern and only a desired place has to be subjected to the etching treatment in an etching treatment process to be performed later. Therefore, waste of a gas to be used at the time of the etching treatment is reduced, and efficiency of use of a gas is improved.

Figure 3B:
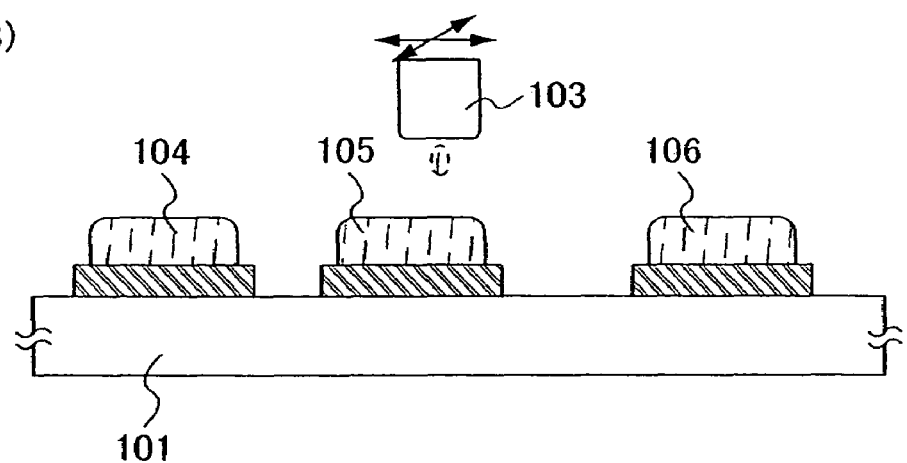

Subsequently, a photoresist (photosensitive resin) reactive to an ultraviolet ray is formed on the conductive films 102 with the ink droplet jet method to form resists 104 to 106 (FIG. 3(B)). More specifically, a compound containing a photosensitive agent is jetted from a head 103 to form the resists 104 to 106 on the conductive films 102.

Figure 5A:
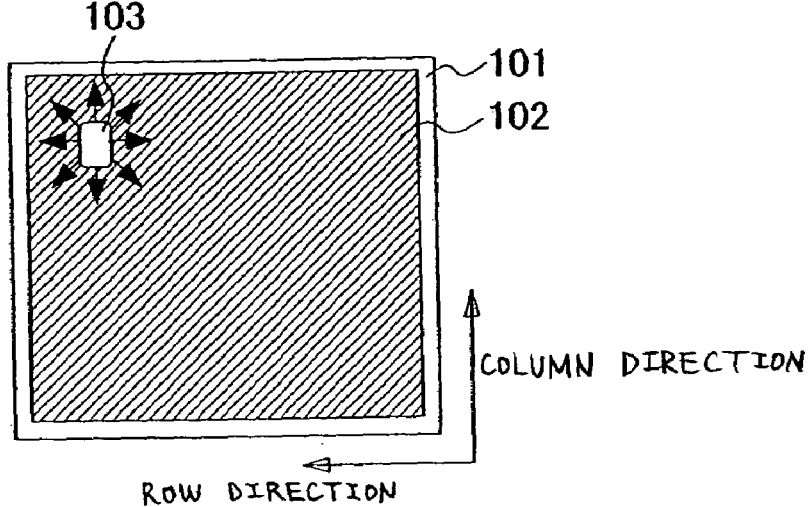
FIGS. 5(A) to 5(E) illustrate the manufacturing method for wiring.
Figure 5B:
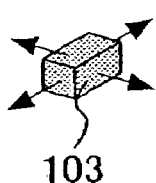
Figure 5C:
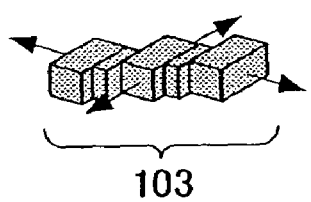

A top view at this point is shown in FIG. 5(A). The head 103 can scan vertically and horizontally in a state in which the head 103 is parallel to the surface of the substrate 101. Note that, although one head 103 is shown in FIGS. 5(A) and (B), plural (e.g., three) heads 103 may be used as shown in FIG. 5(C). In addition, it is also possible that plural heads with different nozzle diameters are prepared, and the heads with different diameters are chosen according to an application. In the case in which the plural heads 103 are used, the heads 103 may scan in parallel with a row direction and a column direction of the substrate 101 or may scan in an oblique direction with respect to the row direction and the column direction of the substrate 101. In addition, the head 103 may scan the same place plural times to apply an ink repeatedly. Moreover, although it is preferable to perform scanning with the head 103, the substrate 101 may be moved. It is advisable that which of the head 103 and the substrate 101 should be moved is decided according to accuracy of the movement and an application. Note that it is preferable to provide the substrate 101 and the head 103 as close as possible in order to drip ink on a desired place, and it is preferable that a distance between the substrate 101 and the head 103 is set to, specifically, 3 millimeters or less, preferably, 1 millimeter or less, and more preferably, 0.5 millimeters or less. Since this accurate jet of an ink droplet also depends upon the distance, it is also possible that a sensor or the like for measuring a distance is used such that this distance can be retained accurately.

Note that, although the conductive film 102 is formed by the CVD method, the evaporation method, or the sputtering method in a selective manner, FIG. 5(A) shows, in a simplified manner, the case in which the conductive film 102 is formed over the entire surface on the substrate 101.

As a compound to be jetted from the head 103, a compound containing a photosensitive agent only has to be used. For example, a compound obtained by dissolving or dispersing novolac resin serving as a representative positive resist and naphthoquinone-azide compound serving as a photosensitive agent, base resin serving as a negative resist, diphenylsilanediol and an acid generating agent, or the like in a solvent is used. As the solvent, esters such as butyl acetate or ethyl acetate, alcohols such as isopropyl alcohol or ethyl alcohol, and organic solvents such as methyl ethyl ketone, or acetone are used. It is advisable to set concentration of the solvent appropriately according to a type or the like of a resist.

In addition, as a material other than the above, the compound to be jetted from the head 103 may be a resin material such as epoxy resin, acrylic resin, phenol resin, novolac resin, acrylic resin, melamine resin, or urethane resin. Note that, in the case in which these resin materials are used, viscosity thereof is adjusted by dissolving or dispersing the resin material using a solvent.

It is preferable that an amount of a compound to be jetted at a time from the head 103 is 10 to 70 pl (more widely, 0.001 to 100 pl), and viscosity is 100 cp or less, and a particle diameter is 0.1 µm or less (more widely, 1 µm or less) and it is more preferable that a nozzle diameter is 5 to 100 µm (more widely, 0.01 to 100 µm). This is for the purpose of preventing drying from occurring and because, if the viscosity is too high, a compound cannot be jetted from the ink jet port smoothly. Viscosity, surface tension, drying speed, and the like of the compound are adjusted properly according to a solvent to be used and an application. In addition, it is preferable that the compound to be jetted from the head 103 drips successively on the substrate to be formed linearly or in a stripe shape. However, the compound may be dripped for each predetermined place, for example, for each dot.

In addition, the formation of a resist pattern by the ink droplet jet method is processed under the atmospheric pressure and under decompression (including a pressure close to the atmospheric pressure and vacuum). "Under decompression" means a pressure lower than the atmospheric pressure, in the atmosphere filled with nitrogen, a rare gas, or other inert gases, for example, $1 \times 10^2$ to $2 \times 10^4$ Pa (preferably, $5 \times 10^2$ to $5 \times 10^3$ Pa) is sufficient. In the higher vacuum (under decompression), 1 to $5 \times 10^4$ Pa ($1 \times 10^2$ to $1 \times 10^3$ Pa) is sufficient. Under decompression, a solvent always volatilizes from a droplet and a volume of the droplet decreases until the droplet reaches a thin film on a substrate. Therefore, the heating process to be performed later can be performed in a shorter time as required.

Then, when formation of the resist patterns 104 to 106 ends, pre-bake treatment for baking a resist pattern at about 100° C. is performed for the purpose of hardening a resist. In this heating treatment, a lamp anneal apparatus, which directly heats a substrate at high speed using a lamp such as halogen as a heating source, or a laser irradiation apparatus, which irradiates a laser beam, is used. Both the apparatuses can apply heating treatment only to a desired place by using the heating source for scanning. However, in the case in which a laser beam is used, it is preferable that a shape of a beam spot of a laser beam, which is emitted from a laser oscillator, is formed linearly such that a length of a column or a row is the same as a length of one side of a pattern. Then, laser irradiation can be finished by performing scanning once. As another method, a furnace anneal oven, which is set to a predetermined temperature, may be used.

Figure 3C:
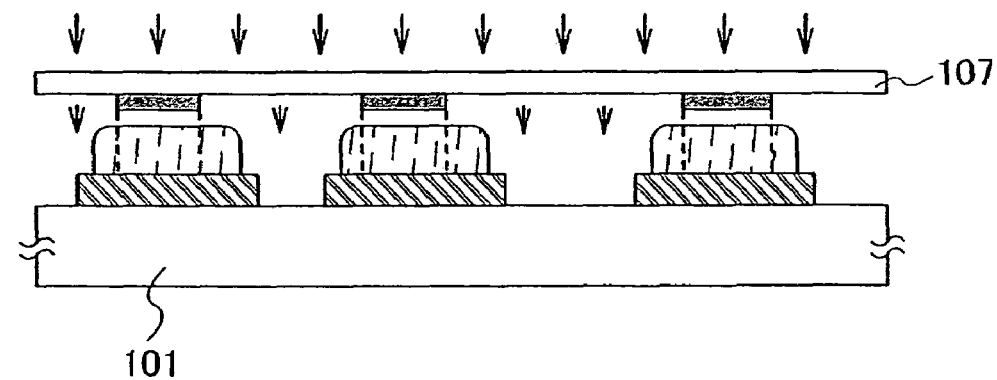

Next, exposure treatment is performed (FIG. 3(C)). The exposure treatment is a treatment for laying a mask (photo mask) 107, in which a target pattern is written in advance, over the resists 104 to 106 and irradiating an ultraviolet ray from above the mask 107. In this treatment, an entire surface of a substrate is divided by every several parts and a light source such as an ultraviolet ray lamp is used to irradiate light of a photosensitive wave length area of a photosensitive agent.

Figure 4A:
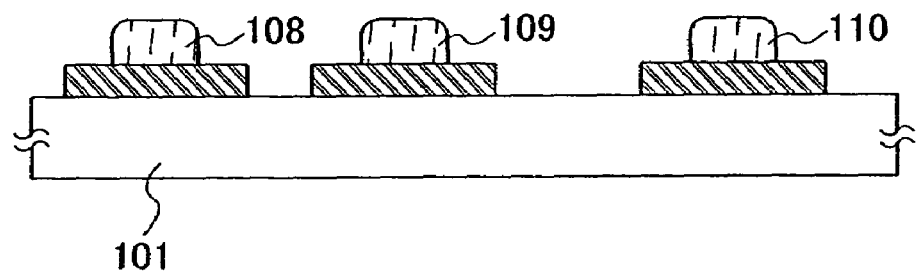
FIGS. 4(A) to 4(C) illustrate a manufacturing method for wiring.

Subsequently, development treatment for immersing the resists of parts, on which the ultraviolet ray was irradiated by the exposure, in a development liquid to remove the resists is performed to change the pattern baked by the exposure into actual resist patterns 108 to 110 (FIG. 4(A)). Then, post-bake treatment for baking the resist patterns at about 120° C. is performed.

Figure 4B:
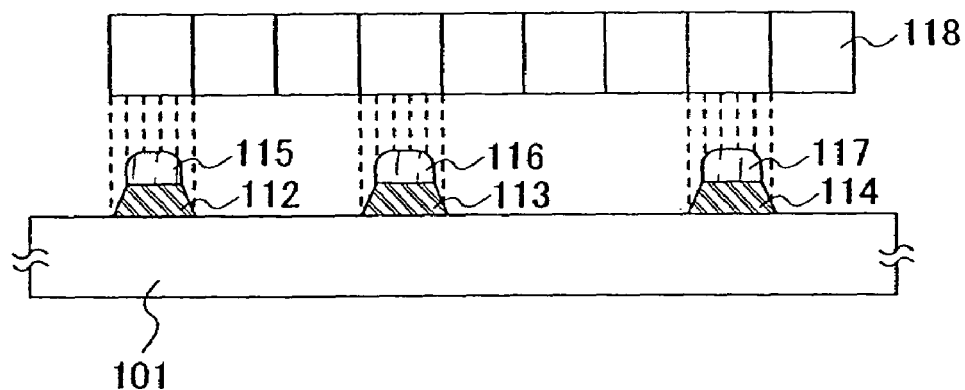

Next, etching treatment is applied to the film of parts not covered by the resist patterns 108 to 110 using the plasma generating means 118 to remove the film (FIG. 4(B)). The invention is characterized by performing dry etching treatment using plasma under the atmospheric pressure or a pressure close to the atmospheric pressure. An etching gas only has to be selected appropriately according to an object to be processed, and the etching treatment is performed using a fluorine etching gas such as $CF_4$, $NF_3$, or $SF_6$ or a chlorine etching gas such as $Cl_2$ or $BCl_3$. In this embodiment mode, utilizing the fact that a resist which is an organic material is also etched using a gas mixed with oxygen, a conductive layer is etching in a taper shape to form conductive layers 112 to 114 and resist patterns 115 to 117.

Figure 4C:
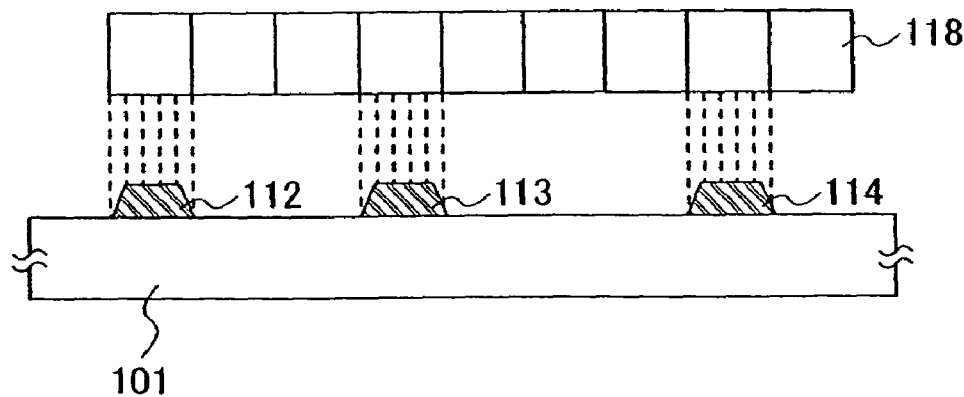

Finally, ashing treatment is applied to the resist patterns 115 to 117 using the plasma generating means 118 to remove the resist patterns (FIG. 4(C)). The present invention is characterized by using a plasma asher that causes a gas in a form of plasma and a resist to react with each other at the atmospheric pressure or a pressure close to the atmospheric pressure to vaporize and remove the resist. Note that, in the plasma asher, an oxygen gas is generally used, and since the resist is a solid object consisting of carbon, oxygen, and hydrogen, the plasma asher utilizes a phenomenon in which the resist changes to a gas such as $CO_2$, $H_2O$, or $O_2$ when the resist chemically reacts with oxygen plasma. Note that, in the case in which this plasma asher is used, since impurities such as heavy metal contained in an actual resist are not removed, the resist may be cleaned in a wet station.

The present invention is characterized in that the etching treatment and the ashing treatment are performed by scanning with plural plasma generating means arranged linearly. Vacuum equipment is not required in the treatments, which makes it possible to improve productivity and reduce manufacturing cost. In addition, it is advantageous in terms of tact time by using the plural plasma generating means arranged linearly. Preferably, if the plural plasma generating means are arranged linearly so as to have the same length as one side of the substrate, the treatment can be finished by performing scanning once. Note that a scanning direction is not limited to a direction parallel to the one side of the substrate, and the scanning may be performed in an oblique direction.

In addition, it is unnecessary to supply a reactant gas from all the plasma generating means among the plural plasma generating means arranged linearly, and the treatment can be performed if a predetermined gas flow is supplied only to a target point. Therefore, the invention, with which it is unnecessary to always supply a reactant gas, leads to saving of a gas and makes it possible to reduce manufacturing cost.

Patterns of the conductive layers 112 to 114 can be formed on the substrate 101 as described above. Note that it is preferable to form the patterns of the conductive layers 112 to 114 at 5 to 50 μm in the case of gate wiring (capacitive wiring) and 5 to 25 μm in the case of source wiring. In this embodiment mode, one form of forming a pattern consisting of a conductive material on the substrate 101 is indicated as an example in this embodiment mode. However, the invention is not limited to this but can be applied to various fields such as a wiring formation process for a semiconductor integrated circuit and a wiring formation process for a TFT substrate constituting a liquid crystal panel or an EL panel. In other words, the present invention is not limited to the example in this embodiment mode but can also be applied in the case of forming a pattern of an insulating film such as silicon oxide or acrylic resin and a semiconductor such as polysilicon or amorphous silicon.

(Embodiment Mode 2)

An embodiment mode of the invention will be explained using the drawings. In this embodiment mode, a form of performing etching treatment in a selective manner using the above-mentioned plasma treatment apparatus to manufacture an aperture (contact hole) will be explained.

In FIG. 6(A), a semiconductor layer (or a conductive layer or a wiring layer) 125 is formed on the substrate 101 and an insulating film 126 is formed on the semiconductor layer 125 by a publicly-known method. Then, resist patterns 127 and 128 are formed on the insulating film 126 in places other than a place where an aperture is to be formed. When the substrate 101 comes into this state, etching treatment is performed by the plasma supplying means 12. Then, as shown in FIG. 6(B), a contact hole 129 reaching the semiconductor layer 125 can be formed. This contact hole has a size of about 2.5 to 30 μm depending upon a diameter of the plasma supplying means 12 or resolution of a display panel to be used.

This embodiment mode is characterized in that the etching treatment is performed by using plural plasma generating means arranged linearly for scanning under the atmospheric pressure or a pressure close to the atmospheric pressure, and plasma is generated only in one or more plasma supplying means selected out of the plural plasma supplying means. Since vacuum equipment is not required in the treatment, the treatment makes it possible to improve productivity and reduce manufacturing cost. In addition, it is advantageous in terms of tact time by using the plural plasma generating means arranged linearly. Preferably, if the plural plasma generating means are arranged linearly so as to have the same length as one side of the substrate, the treatment can be finished by performing scanning once. Note that a scanning direction is not limited to a direction parallel to the one side of the substrate, and the scanning may be performed in an oblique direction.

In addition, it is unnecessary to supply a reactant gas from all the plasma generating means among the plural plasma generating means arranged linearly, and the treatment can be performed if a predetermined gas flow is supplied only to a target point. Therefore, the invention, with which it is unnecessary to always supply a reactant gas to all the plasma supplying means, improves efficiency in use of a gas and makes it possible to reduce manufacturing cost.

Another example of the invention is shown in FIG. 6(C) to FIG. 6(E).

After forming an interlayer insulating film in an island shape in a selective manner with the ink jet method (ink droplet jet method), plasma treatment is performed in a selective manner to adjust a shape of the insulating film, whereby the interlayer insulating layer having a contact hole is formed. The invention is characterized in that the interlayer insulating film is formed by the ink jet method.

First, as in FIG. 6(A), the semiconductor layer or the wiring layer (conductive layer) 125 is formed on the substrate 101. Here, the wiring layer 125 consisting of metal will be explained as an example. A solution containing a polymeric material (representatively, polyimide, acrylic, benzocyclobutene, etc.) is jetted and applied to a predetermined position of the substrate 101 by the ink jet method, and baking is performed to remove a solvent to form an insulating layer 130*a* (FIG. 6(C)). Through this process, a part of the wiring layer 125 is exposed. The exposed part is a place that becomes a contact hole later. Note that, since a thickness is required to some extent in order to cause the insulating film 120*a* as an interlayer insulating film, a desired thickness may be obtained by repeating jetting and application and preliminary baking (or baking) of the solution.

In addition, as a material of the insulating layer 130*a*, a photosensitive or non-photosensitive organic material (polyimide, acrylic, polyamide, polyimide-amide, resist, or benzocyclobutene), lamination of these materials, or the like can be used appropriately. Further, as the insulating layer 130*a*, both of a negative dielectric layer, which becomes soluble with respect to an etchant due to photosensitive light, or a positive dielectric layer, which becomes soluble with respect to an etchant due to light, can be used.

Since a material is not applied over an entire surface of a substrate as in the spin coat method, the invention can save the material significantly.

Subsequently, as shown in FIG. 6(D), an end of the insulating layer 130*a* is etched in a selective manner by the plasma treatment using the plasma supplying means (nozzle) 12 to form a contact hole in the insulating layer 130*a*. This etching also servers as treatment for adjusting a shape of the insulating layer 130*a*. The contact hole is formed by enlarging a hole, which is opened in the insulating layer 130*a* in advance, and an insulating layer 130*b* is formed. Since parts to be etched are less compared with etching of the conventional photolithography, the contact hole can be formed in a short time. Since etching is not performed using a resist mask, the invention can leave out a resist formation process.

In addition, in the case in which dusts such as an impurity are present simultaneously in a part where the wiring layer 125 is exposed, the dusts can also be removed. Further, in the case in which a natural oxide film is formed in the part where the wiring layer 125 is exposed, the natural oxide film can also be removed.

Subsequently, wiring 131 is formed as shown in FIG. 6(E). Note that the insulating layer 130*b* functions as an interlayer insulating film. If wiring is formed by the ink jet method, a mask-less process can be realized, which can be a process suitable for mass production.

It is possible to combine the embodiment mode with the above-mentioned embodiment mode freely.

(Embodiment Mode 3)

First, as a characteristic of the invention, etching treatment or ashing treatment is performed under the atmospheric pressure or a pressure close to the atmospheric pressure. Thus, an example of a plasma treatment apparatus, which is used in the invention, will be explained using the drawings.

Figure 17A:
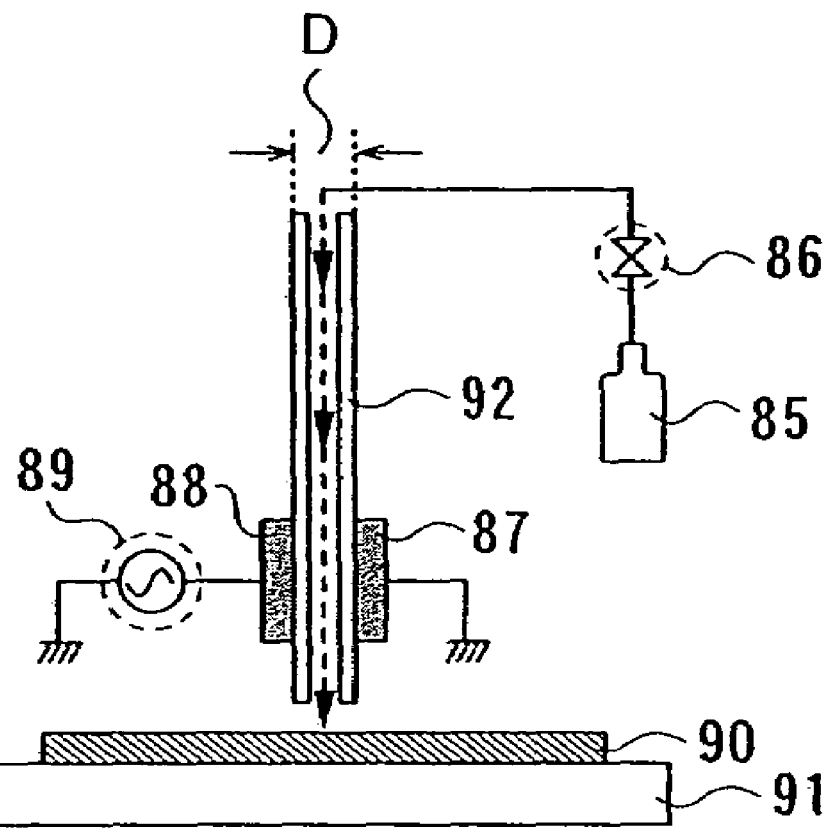
FIGS. 17(A) and 17(B) illustrate a plasma treatment apparatus.

In FIG. 17(A), plasma supplying means has a nozzle 92 formed of glass or quartz glass. Further, a first electrode (high-frequency electrode) 88, which is connected to a high-frequency power supply 89, and a grounded second electrode (ground electrode) 87 are arranged to be opposed to each other in a lower part of the nozzle 92, and a high-frequency voltage is applied between the first electrode 88 and the second electrode 87.

Gas supplying means (gas cylinder) 85 is connected to the nozzle 92 via a valve 86. A predetermined gas is supplied to this gas supplying means 85 via the valve 86. A stage 91 consisting of a stainless plate or the like is disposed under the nozzle 92, and an object to be treated 90, on which a gas flow in a form of plasma is irradiated, is arranged on an upper surface of this stage 91.

Then, for example, an appropriate amount of oxygen gas or tetrafluoric carbon gas or oxygen gas and tetrafluoric carbon gas are added to a rare gas, and an obtained gas is supplied to the nozzle 92 in an atmospheric state as a discharge gas, while a high-frequency voltage is applied to the first electrode 88. Consequently, plasma is generated between both the electrodes. Then, when a reactive gas flow, which contains chemically active excited species such as ion and radical generated by this plasma, is irradiated toward the surface of the object to be treated 90, predetermined surface treatment can be performed on the surface of the object to be treated 90.

Figure 17B:
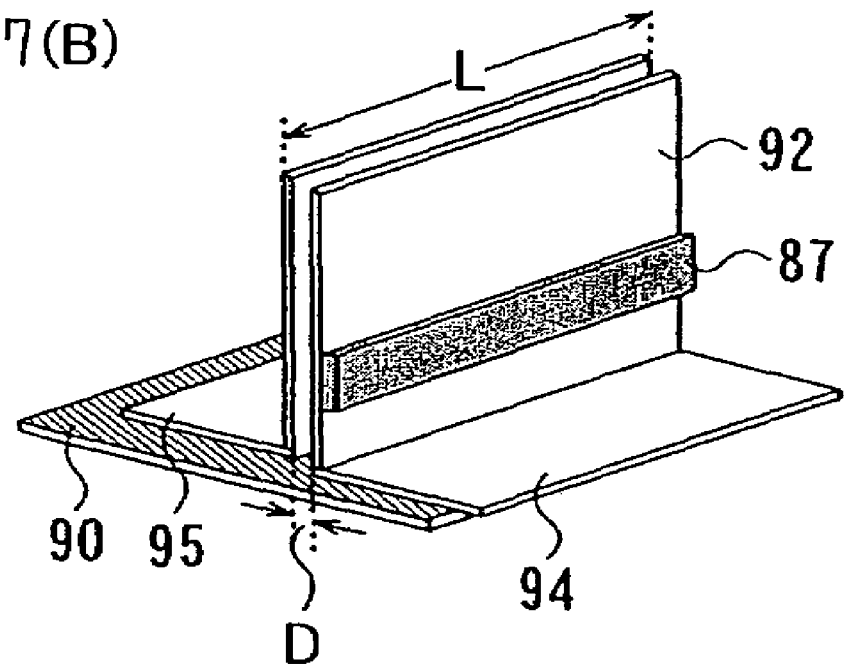

Subsequently, a perspective view of the plasma treatment apparatus shown in FIG. 17(A) is shown in FIG. 17(B). Walls of the nozzle 92 are arranged in parallel to be opposed to each other, and a gas flow path is formed in a gap thereof. Further, the first electrode 88 (not shown) connected to the high-frequency power supply 89 is disposed along a longitudinal direction of the nozzle 92, and the second electrode 87 is disposed so as to be opposed to the first electrode 88. Fin plates 94 and 95 perpendicular to the nozzle 92 are provided at a lower end of the nozzle 92. Note that gas control means (not shown), which has plural supply holes along the gas flow path and is used for supplying the discharge gas to the gas flow path uniformly, is provided in an upper part of the nozzle 92. In addition, sides of the gas flow path are covered by side plates (not shown) such that a reactive gas flow generated in the gas flow path can be jetted only from the lower part of the gas flow path.

The plasma treatment apparatus used in the invention having the above-mentioned structure can generate linear discharge and can perform predetermined ashing treatment or etching treatment by irradiating a reactive gas flow due to plasma generated by this discharge on the object to be treated 90.

In addition, a plasma treatment apparatus with a structure different from that of FIG. 17 will be explained using the drawings. FIG. 18(A) is a top view of the plasma treatment apparatus in accordance with the invention, and FIG. 18(B) is a sectional view. In FIGS. 18(A) and (B), an object to be treated 12a such as a glass substrate, a resin substrate, or a semiconductor substrate, which are subjected to surface treatment, is set in a cassette chamber 21a. As the object to be treated 12a, a substrate of a desired size is used. Note that it is preferable to apply pre-treatment such as cleaning to a substrate to be set in the cassette chamber 21a.

Reference sign 22a denotes a conveyance chamber, which conveys the object to be treated 12a arranged in the cassette chamber 21a to a plasma treatment chamber 23a with a conveyance mechanism 20a (e.g., robot arm). As a conveying system for the object to be treated 12a, there is horizontal conveyance. However, in the case in which a substrate of a fifth generation or later is used as the object to be treated 12a, vertical conveyance with the substrate placed vertically may be performed for the purpose of reducing an area occupied by a conveyor. In a plasma treatment chamber 23a adjacent to the conveyance chamber 22a, airflow control means 18a, which creates a flow of air so as to block the external air for dustproof and also performs conveyance of the object to be treated 12a, heating means 19, and plasma generating means 25 are provided. The heating means 19 only has to use publicly-known heating means such as a halogen lamp and heats the object to be treated 12a from a lower surface thereof. Reference sign 18a denotes airflow control means, and reference numeral 26 denotes a blowout port for a gas, which controls an airflow using a conveying gas such as an inert gas supplied from the gas supplying means 29. Since the plasma treatment apparatus used in the invention is operated under the atmospheric pressure or a pressure close to the atmospheric pressure, contamination from the outside and backflow of a product of reaction can be prevented simply by controlling an airflow near the plasma generating means 25 with the airflow control means 18a. In other words, it is also possible to perform separation from the outside only with the airflow control means 18a, and it is unnecessary to completely close the plasma treatment chamber 23a. In addition, in the present invention, time for evacuation and air opening necessary for a decompression device is not required, and it is unnecessary to arrange a complicated vacuum system.

In addition, a gas supplied from the gas supplying means 29 is heated to a desired temperature (e.g., 50 degrees to 800 degrees) by a heating means 28, and the object to be treated 12a is heated by blowing the heated gas to the object to be treated 12a. The heating means 28 is not specifically limited, and any publicly-known heating means may be used as long as the heating means can heat a gas. In the invention, the heated gas is blown to an upper surface of the object to be treated 12a, and a lower surface of the object to be treated 12a is further heated by the heating means 19. The object to be treated 12a is heated uniformly by heating both the surfaces of the object to be treated 12a. In addition, an inert gas only has to be used as the conveying gas to be supplied from the gas supplying means 29.

Figure 18:
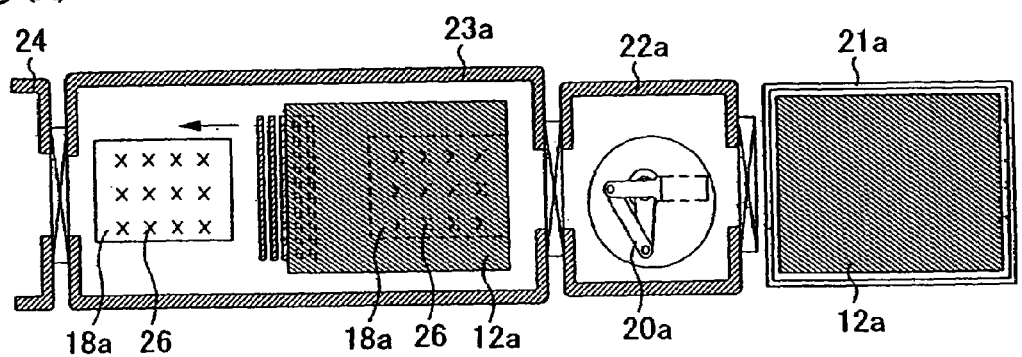
FIGS. 18(A) and 18(B) illustrate the plasma treatment apparatus.
Figure 18:
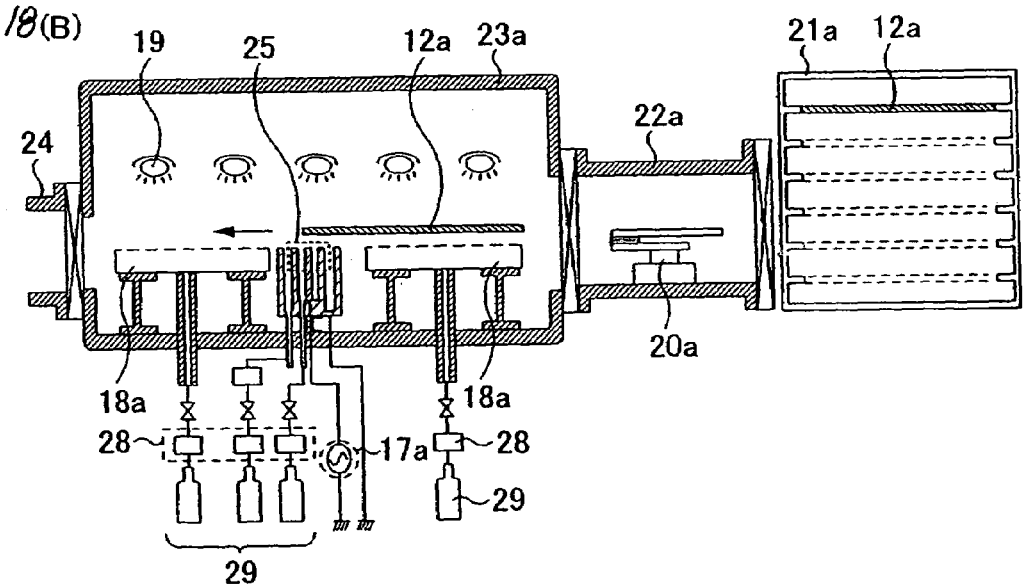

The plasma generating means 25 is constituted by a first electrode 13a and a second electrode 14a and is connected to a high-frequency power supply 17a, an exhaust system, gas supplying means, and the like (FIG. 18). The object to be treated 12a, which has been subjected to predetermined surface treatment in the plasma treatment chamber 23a, is conveyed to a conveyance chamber 24 and conveyed to another treatment chamber from this conveyance chamber 24.

Note that it is advisable to cover one or both of the first electrode 13a and the second electrode 14a with a solid dielectric. Examples of the solid dielectric include metal oxides such as aluminum oxide, zirconium dioxide, and titanium dioxide, organic materials such as polyethylene terephthalate and polytetrafluoro-ethylene, and oxides such as silicon oxide, glass, and barium titanate. It is preferable that thickness of the solid dielectric is 0.05 to 4 mm. This is because, since a high voltage is required to generate discharge plasma, if the solid dielectric is too thin, dielectric breakdown occurs at the time of voltage application to cause arc discharge.

Subsequently, a detailed structure of the plasma generating means 25 will be explained using a sectional view of FIG. 19. Dotted lines in FIG. 19 indicate paths for a gas. Reference numerals 13a and 14a denote electrodes comprising metal having conductivity such as aluminum, copper, or stainless steel, and the first electrode 13a is connected to the power supply (high-frequency power supply) 17a. Note that a cooling system (not shown) for circulating a cooling water may be connected to the first electrode 13a. By providing the cooling system, it becomes possible to prevent heating in the case in which surface treatment is performed consecutively by circulation of the cooling water to improve efficiency by consecutive treatment. The second electrode 14a has a shape surrounding the periphery of the first electrode 13a and is electrically grounded. Then, the first electrode 13a and the second electrode 14a have a cylindrical shape with a nozzle-like gas supply port at tips thereof. A gas heated by the heating means 28 is supplied to a space between both the first electrode 13a and the second electrode 14a. Then, the atmosphere in this space is replaced, and a high-frequency voltage (e.g., 10 to 500 MHz) is applied to the first electrode 13a by the high-frequency power supply 17a in this state to generate plasma 11 in the space. A reactive gas flow, which contains chemically active excited species such as ion and radical generated by this plasma 11, is irradiated toward the surface of the object to be treated 12a, whereby surface treatment such as formation of a thin film and cleaning on the surface of the object to be treated 12a is performed.

Figure 19:
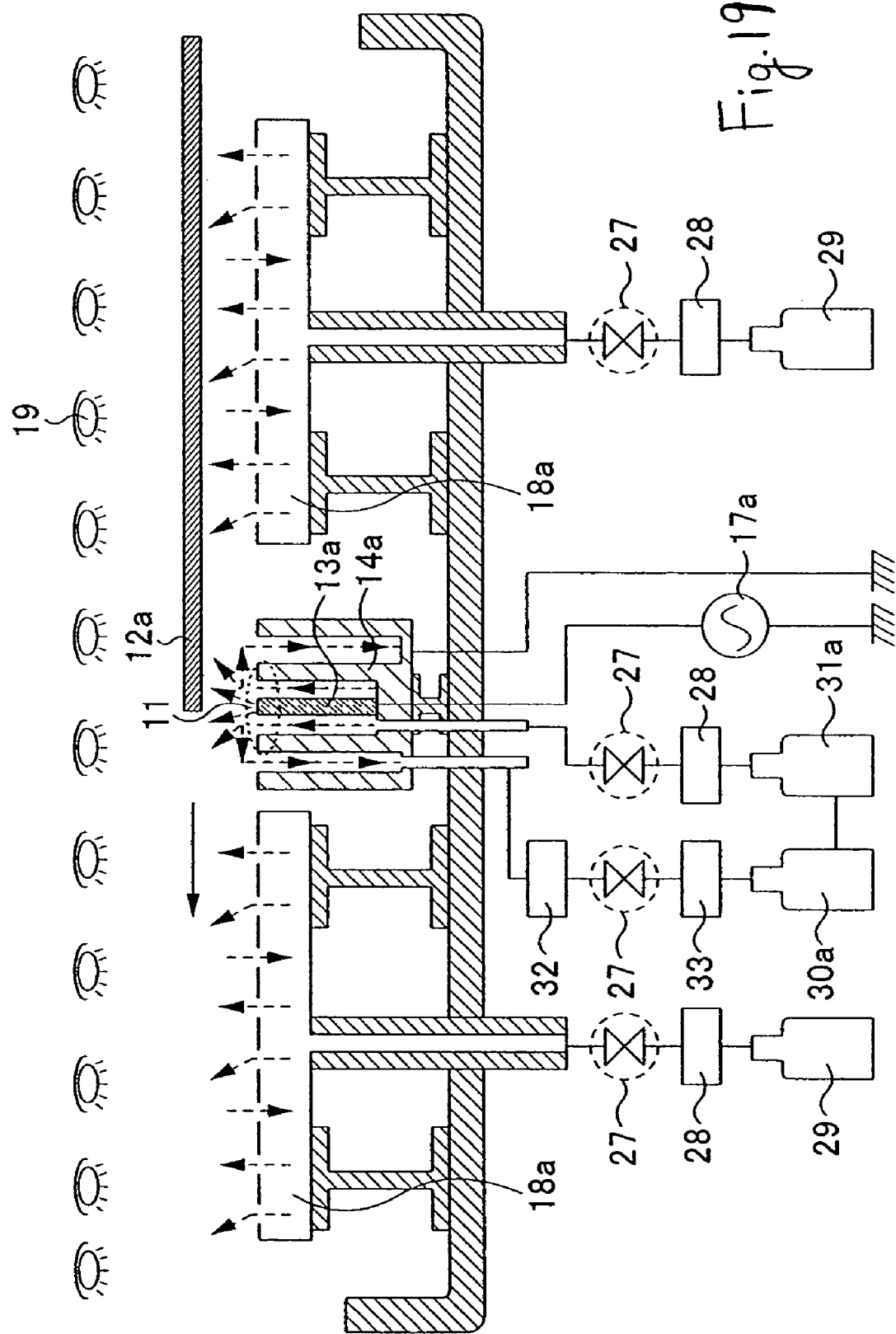
FIG. 19 is a diagram showing the plasma treatment apparatus.

In addition, in FIG. 19, reference numeral 27 denotes valves; 28 denotes heating means; 29, 30a, and 31a denote gas supplying means; 32 denotes an exhaust gas; and 33 denotes a filter. The heating means 28 heats a gas supplied by the gas supplying means 9, 30a, and 31a to a desired temperature (e.g., 50 to 800 degrees). Note that reference numeral 29 denotes gas supplying means for a conveying gas; 30a denotes a gas supplying means for refined gas; and 31a denotes a gas supplying means for a process gas. As the conveying gas, a gas, which does not affect surface treatment performed in a treatment chamber, such as an inert gas is used. In addition, the process gas is set appropriately according to a type of the surface treatment performed in the treatment chamber. The exhaust gas 32 is introduced into the filter 28 via the valves 27. The filter 28 removes dusts mixed in the exhaust gas. Then, the gas refined by the filter 33 is introduced into the gas supplying means 30a for refined gas again and used as a process gas again.

In addition, as described above, the object to be treated 12a is floated horizontally by a gas blown in an oblique direction and a vertical direction from the airflow control means 18a and a gas from the space between both the electrodes and is conveyed in a direction of progress in a non-contact state. Near the electrodes, a gas blows out upward, and the object to be treated 12a is lifted by this gas. In addition, near the airflow control means 18a, blowing of a gas and suction of a gas are performed simultaneously to control height to which the object to be treated 12a is lifted. Moreover, horizontal accuracy of the object to be treated 12a is adjusted according to a flow rate of a gas using the valves 27 to adjust a distance between the object to be treated 12a and the first and the second electrodes 13a and 14a precisely. With this structure, even for the large and thin object to be treated 12 that is hard to be conveyed, a situation in which the object to be treated 12 is distorted, warps, or in the worst case, cracked is prevented.

Figure 20A:
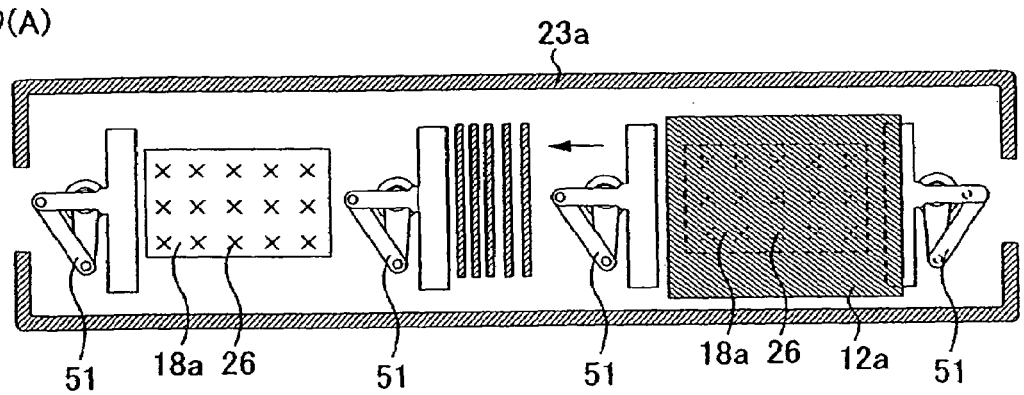
FIGS. 20(A) to 20(C) illustrates the plasma treatment apparatus.
Figure 20B:
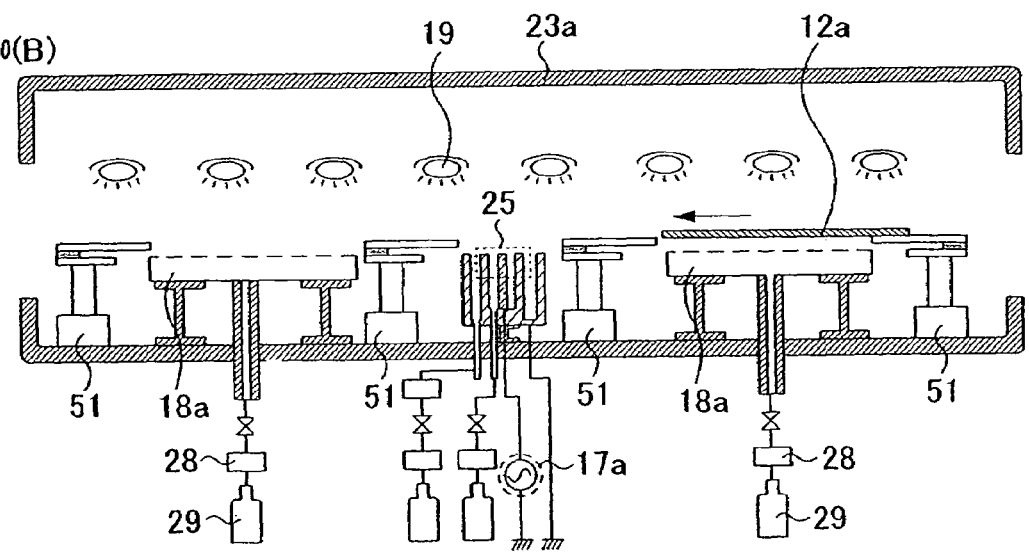
Figure 20C:
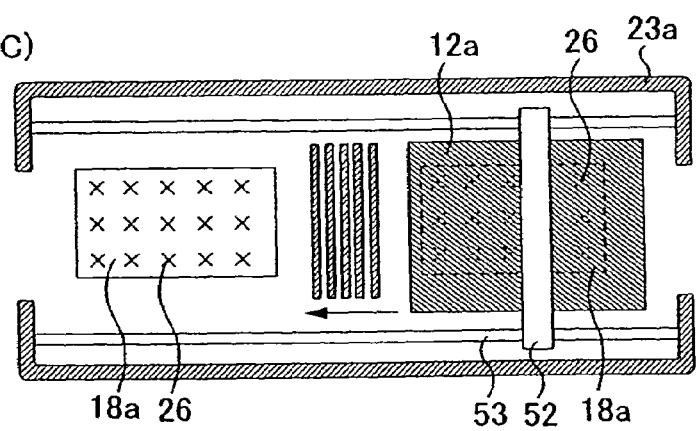

In addition, unlike FIG. 18 referred to above, as shown in FIGS. 20(A) and (B), the object to be treated 12a may be conveyed using airflow control means 18 and mechanical robot arms (conveyance mechanisms) 51. Then, the object to be treated 12a can be conveyed horizontally to the progress direction. In addition, rather than the robot arms 51, a rail 53 may be set in the direction of progress of the object to be treated 12a as shown in FIG. 20(C) to convey the object to be treated 12a horizontally using a truck 52 traveling on the rail 53.

(Embodiments)

[Embodiment 1]

Embodiments of the invention will be explained using the drawings.

Figure 7:
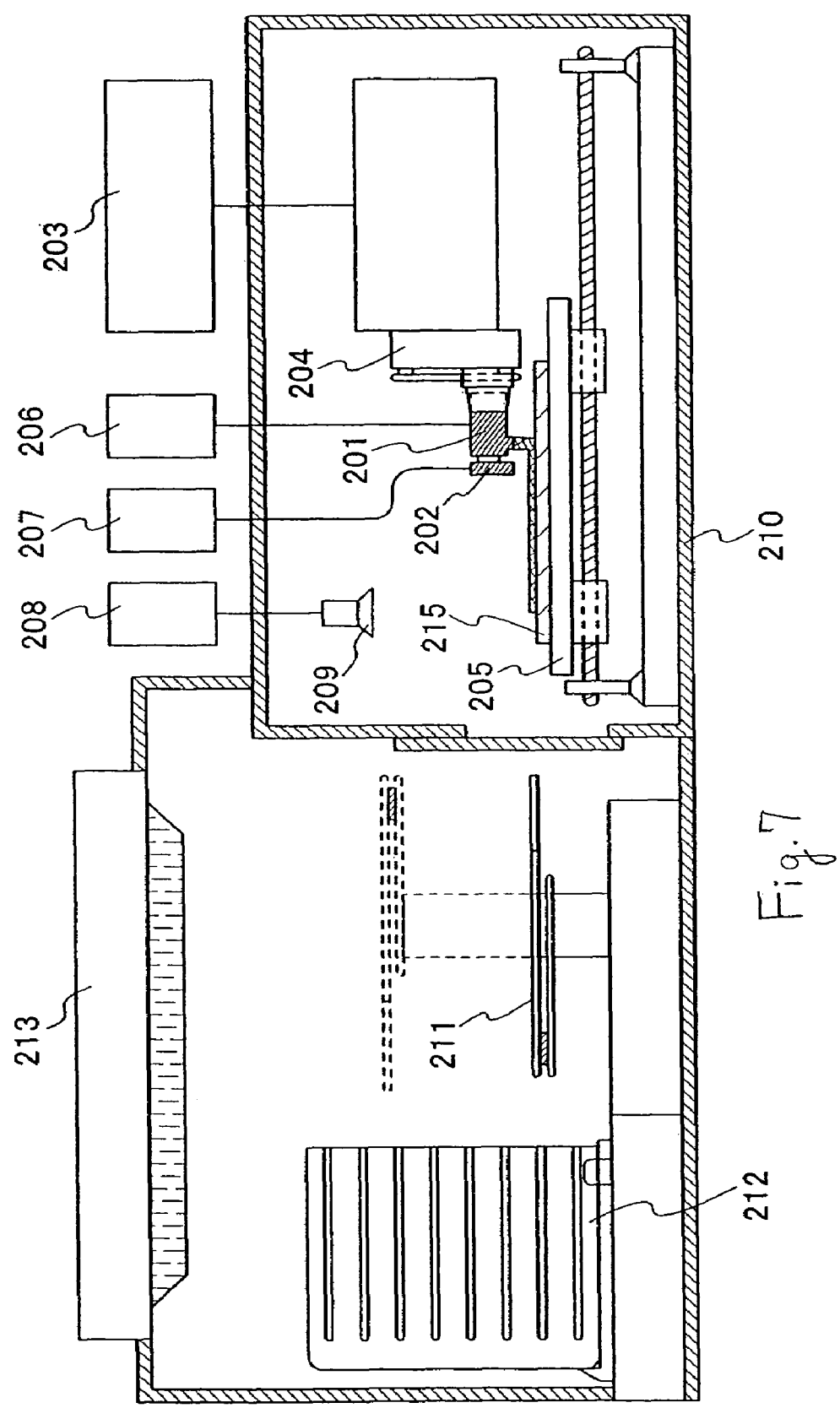
FIG. 7 illustrates an ink droplet jet apparatus.

FIG. 7 shows an ink droplet jet apparatus using an ink droplet jet method. When a predetermined resist pattern is formed on a substrate 215 using the apparatus, a period for jetting a compound from a head (ink head) 201 and a moving speed of the substrate 215 are adjusted. Note that a nozzle 202, which blows out a gas, may be provided adjacent to the head 201, as smoothing means for a compound. The compound jetted on the substrate 215 is smoothed by the gas blown out from this nozzle 202. In other words, the head 201 or the substrate 215 is moved while keeping a distance between the head 201 and the substrate 215, whereby a linear pattern is formed. At this point, the pattern can be smoothed by blowing out the air from the nozzle 202. In addition, in order to improve accuracy of a position of impact of the jetted compound, it is preferable to bring a space between the head 201 and the substrate 215 close to 1 millimeter or less. For this purpose, a moving mechanism 204, with which the head 201 moves up and down, and control means 203 therefor are provided such that the head 201 is brought close to the substrate 215 only at the time of pattern formation.

Besides, the apparatus fixes the substrate 215 and makes the substrate 215 movable in an XYθ direction and is constituted by a substrate stage 205 that fixes the substrate 215, means 206 that supplies a compound to the head 201, means 207 that supplies a gas to the nozzle 202, and the like. A housing 210 covers the head 201, the substrate stage 205, and the like. In addition, when the apparatus is used, if the same gas as a solvent of a compound is supplied by the gas supplying means 208 and a shower head 209 provided inside the housing 210 to replace the atmosphere, drying can be prevented to some extent, and printing can be continued for a long time. Besides, as incidental elements, the apparatus may include a carrier 212 that holds the substrate 215 to be treated, conveying means 211 that conveys the substrate 215 into and out of the carrier 212, a clean unit 213 that blows out clean air to reduce dusts in a work area, and the like.

Figure 5D:
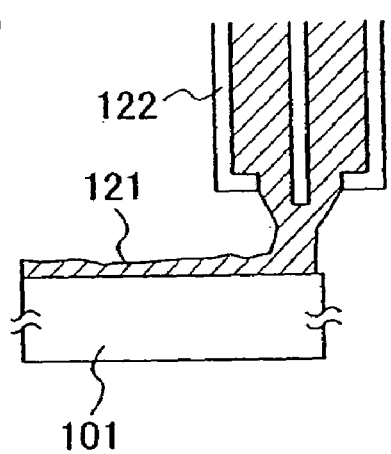
Figure 5E:
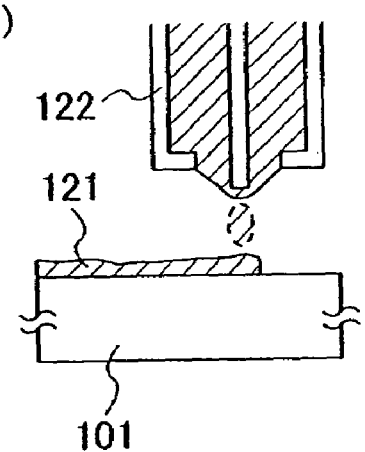

FIGS. 5(D) and (E) show sectional views of the head 103. Two methods of jetting a compound from the head 103 will be explained using the drawings. In FIGS. 5(D) and (E), reference numeral 121 denotes a compound and 122 denotes a head. First, as a first method, FIG. 5(D) shows a case in which a method of forming a pattern without stopping jetting of the compound 121 from the head 103, that is, by consecutively jetting the compound 121 is applied. In addition, as a second method, FIG. 5(E) shows a case in which a method of dripping the compound from the head 103 to form a pattern is applied. In the present invention, either of the methods may be used.

Subsequently, described is a flow passing through a film formation chamber 225 in which a conductive layer is mainly formed, an ink droplet jet treatment chamber 227 in which the apparatus of FIG. 7 is incorporated, a laser irradiation chamber 228, a treatment chamber for exposure 225, a cleaning chamber 238, and a plasma treatment chamber 237 in order.

Figure 8:
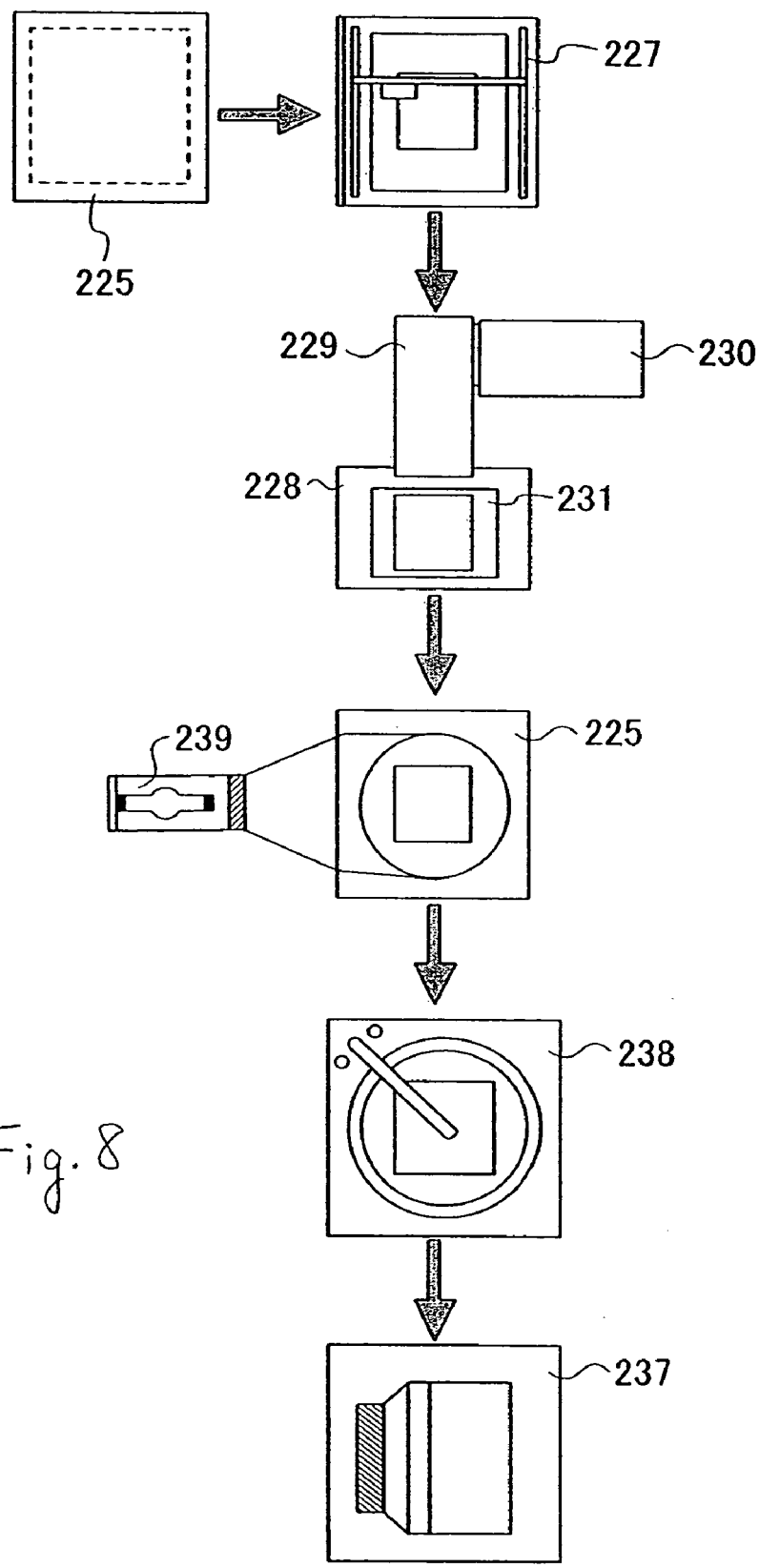
FIG. 8 illustrates a manufacturing flow.

The respective treatment chambers, which are passed through when a semiconductor apparatus is manufactured, will be explained using FIG. 8.

An exhaust pump is provided in the respective treatment chambers as required. As the exhaust pump, an oil rotary pump, a mechanical booster pump, a turbo molecular pump, or a cryopump can be used. However, the cryopump effective for removing moisture is preferable.

A film formation chamber 225 performs selective processing locally using mainly a conductive material and using the CVD method, the evaporation method, or the sputtering method. In other words, a sputtering apparatus (FIG. 9), an evaporation apparatus (FIG. 10), or the like to be described later is provided in the film formation chamber 25.

The ink droplet jet treatment chamber 227 is characterized by performing formation of a resist pattern. The ink droplet jet treatment chamber 227 is constituted as shown in FIG. 7, and one or plural heads shown in FIGS. 5(B) and (C) are provided therein. Further, the ink droplet jet treatment chamber 227 performs formation of a resist pattern by scanning a head or a substrate.

The laser irradiation chamber 228 is used for an application such as heating treatment. The laser irradiation chamber 228 has position control means having a substrate placed thereon and controlling a position of the substrate, a laser oscillator 230, an optical system 229, a computer including both a central processing unit and storing means such as a memory, and the like.

The treatment chamber for exposure 225 is used when exposure treatment is performed after a resist pattern is formed by the ink droplet jet treatment chamber 227. A treatment unit 239 for irradiating light in a photosensitive wavelength range of a photosensitive agent on the resist pattern is provided in the treatment chamber for exposure 225. As the light in a photosensitive wavelength range of a photosensitive agent, in general, light with a wavelength of 350 to 450 nm is required depending upon a photosensitive agent. As preferred example of a light source satisfying the wavelength range, there is a super-high pressure mercury lamp that is generally used as a light source for a one to one projection exposure apparatus of multiwavelength light and a one to one projection exposure apparatus of single wavelength light. The light source is constituted to irradiate multiwavelength light consisting of a g ray (436 nm), an h ray (405 nm), and an i ray (365 nm) that are spectra of the light of the super-high pressure mercury lamp. The treatment unit 239 is constituted by an optical filter, the super-high pressure mercury lamp serving as the light source, a power supply line for supplying power to a super-high pressure mercury lamp 405, and the like. Examples of the optical filter include an absorption filter and a thin film interference filter. The absorption filter and the thin film interference filter are stacked appropriately to subject multiwavelength light consisting of the g ray (436 nm), the h ray (405 nm), and the i ray (365 nm) to spectral transmission. Note that a treatment time for light irradiation is not as strict as in an exposure time in an exposure apparatus. However, since the treatment time affects a softened shape of a resist pattern, an apparatus constitution, with which light irradiation treatment for a predetermined time is performed, is required. As such an apparatus constitution, although not shown in the figure, it is possible that, for example, a shutter mechanism is provided, a mechanism for performing power supply to the super-high pressure mercury lamp only for a predetermined time is provided.

The cleaning chamber 238 is a treatment chamber of a spin coating system and supplies IPA and pure water to perform rinse treatment after exfoliation. Note that the invention is characterized in that a resist is ashed and removed under the atmospheric pressure or a pressure close to the atmospheric pressure by the plasma treatment apparatus in the first and the third embodiment modes. However, depending upon a process, it is also possible that resist exfoliating liquid is supplied to remove a resist in a treatment chamber of the spin coating system like the cleaning chamber 238. In the plasma treatment chamber 237, etching treatment and ashing treatment are performed under the atmospheric pressure or a pressure close to the atmospheric pressure.

Since the apparatus operating under the atmospheric pressure or a pressure close to the atmospheric pressure is used, the invention can provide a manufacturing apparatus that includes the ink droplet jet treatment chamber 227, the plasma treatment chamber 237, a treatment chamber for forming a thin film, moving means that moves a head for jetting ink droplets, and the like as a unit. With the manufacturing apparatus with such a structure, inline treatment can be performed more easily, and reduction of a space and improvement in efficiency of a manufacturing line can be realized.

It is possible to combine the embodiment with the above-mentioned embodiment modes freely.

[Embodiment 2]

An embodiment of the invention will be explained using the drawings.

FIG. 9 is shows an example of a sputtering apparatus of a magnetron system. The apparatus has a film formation chamber 311 including a conveyance port (extraction port) 322 for extracting an object to be treated (substrate). A target 317 is provided in the film formation chamber 311 and is cooled (water-cooled) by a coolant 319 via a backing plate. A permanent magnet 318 makes it possible to form a film with high uniformity of thickness on a surface of a substrate opposed thereto by taking a circular motion or a linear motion in a direction parallel with a target surface. A shutter 323 opens and closes before and after starting film formation to prevent a film from being formed in a state in which plasma is unstable in an initial period of discharge.

A substrate 313 and a mask 314 are set in substrate holding means 312 by moving a substrate holder 327 and a mask holder 328. In this case, it is advisable to perform alignment of the substrate 313 and the mask 314 using a CCD camera 316 provided in the film formation chamber. In addition, a magnetic body (magnet) 315 is provided in the substrate holding means 312, and the substrate 313 and the mask 314 are fixed by the magnetic body 315. In this case, a spacer may be provided to retain a fixed gap (height) such that the substrate 313 and the mask 314 do not come into contact with each other. In addition, means for holding the target 317 has means 326 for moving the target 317 up and down and can control a distance between the substrate 313 and the target 317 at the time of film formation. It is needless to mention that means for moving the substrate 313 up and down may be set in the substrate holding means 312 to control the distance between the substrate 313 and the target 317 at the time of film formation.

Moreover, it is advisable to embed a sheathed heater as heating means to introduce a heated rare gas (argon gas) from the back of the substrate 313 and improve a soaking property. In addition, a rare gas or an oxygen gas is introduced into the film formation chamber 311 from a gas introducing means 321, and a rectifying plate 324, which is controlled by a conductance valve 325, is provided for the purpose of rectifying a flow of a sputtering gas in the film formation chamber 311. A high-frequency power supply 320 is connected to the target 317.

Subsequently, an example of a mask 330, which is used when a conductive film is formed by the sputtering method, is shown in FIG. 9(B). The mask 314 has mask patterns 331 in a slit shape. The mask patterns 331 are set appropriately according to an application thereof, for example, a narrow pattern of 5 to 20 μm is provided for formation of a signal line arranged in a pixel portion and a wide pattern of 150 to 1000 μm is provided for formation of wound-around wiring.

Note that auxiliary wiring may be provided in the mask 314 in parallel with a slit for the purpose of reinforcement. Width, length, and a setting place of this auxiliary wiring only have to be set appropriately so as not to be an obstacle at the time of film formation. If such auxiliary wiring is used, width of a film formation area is prevented from fluctuating or meandering. Such a mask 314 is formed of nickel, platinum, copper, stainless steel, quartz glass, or the like. A mask formed of a metal material is called a metal mask. Depending upon width of wiring to be formed, it is advisable to form the mask 314 so as to have thickness of about 5 to 25 μm.

The invention is characterized in that the mask 314 is arranged so as to be laid on top of the substrate 313, and a thin film is formed on the substrate 313 in a selective manner. More specifically, high-frequency power is applied in the atmosphere containing a rare gas to form a thin film of a desired shape with the sputtering method. In the case in which the mask 314 is arranged in this way to form a thin film of a desired shape, although efficiency in use of a material is not improved in the subsequent etching treatment process, it is unnecessary to apply etching treatment to a thin film in an area other than a place covered by a resist pattern, and the etching treatment only has to be applied to a desired place. Consequently, waste of a gas to be used at the time of the etching treatment is reduced, and efficiency in use of a gas is improved. It is possible to combine this embodiment with the above-mentioned embodiment modes and embodiment freely.

[Embodiment 3]

An embodiment of the invention will be explained using the drawings.

Figure 10A:
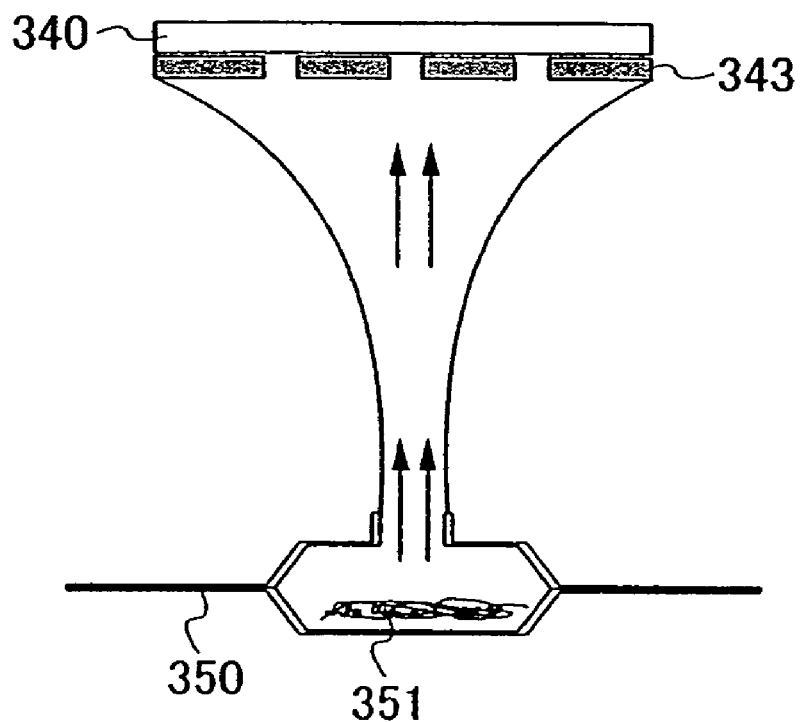
FIGS. 10(A) and 10(B) illustrate an evaporation apparatus.

FIG. 10 shows an example of an evaporation apparatus. In FIG. 10(A), reference numeral 350 denotes a sample boat, and 351 denotes a material. The material placed in the sample boat 350 is vaporized and discharged by resistance heating by an electrode (not shown). In this case, the discharged material adheres on a substrate 340 after passing through gaps of a mask 343 comprising a conductive material. As described above using FIG. 9(B), the mask 343 is constituted by a conductive material such as copper, iron, aluminum, tantalum, titanium, or tungsten.

Note that, in this embodiment, although the resistance heating is explained as an evaporation source, electron beam (EB) heating may be adopted. In addition, a material may be charged to negative or positive in polarity at the time of evaporation.

Figure 10B:
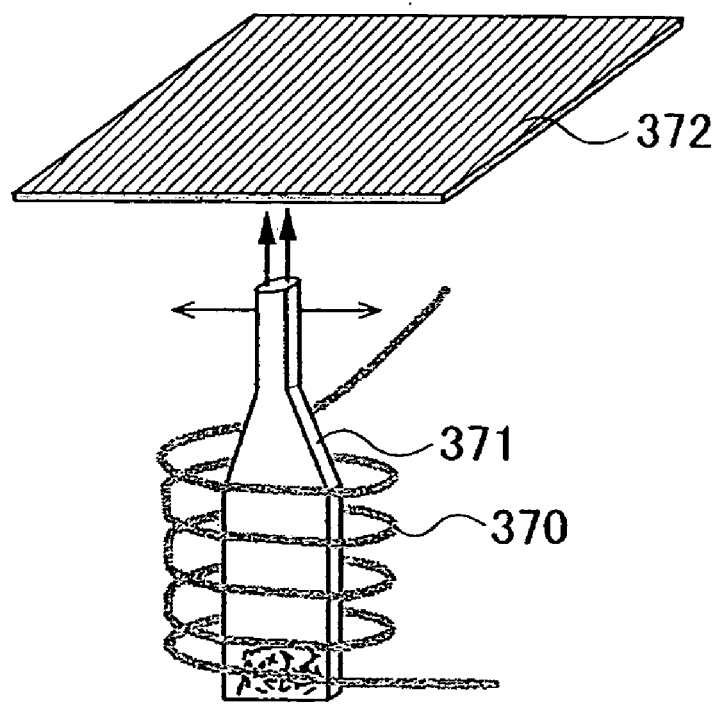

FIG. 10(B) is a diagram showing an example of an evaporation apparatus of an electrification heating type that is different from FIG. 10(A). Reference numeral 370 denotes a filament and 371 denotes a crucible formed of a material (e.g., quartz) resistible against temperature generated by the filament 370. For example, the material may be stainless steel. Then, after placing a powder material in the crucible 371, the filament 370 is heated by energization to evaporate the material in a form of atoms or molecules, and the material in a form of atoms or molecules is adhered to a substrate 372 to form a thin film. Note that, although a filament of a cone basket type is shown in FIG. 10(B), the shape of the filament may be changed appropriately according to an object, and, for example, a filament of a U shape may be used.

In the case of the evaporation apparatus shown in FIG. 10(B), it is unnecessary to always use the metal mask, and a thin film can be formed in a selective manner by reducing a size of a narrow port, through which an evaporation source is supplied, to scan the crucible 371 or the substrate 372.

It is possible to combine this embodiment with the above-mentioned embodiment modes and embodiments.

[Embodiment 4]

Figure 11:
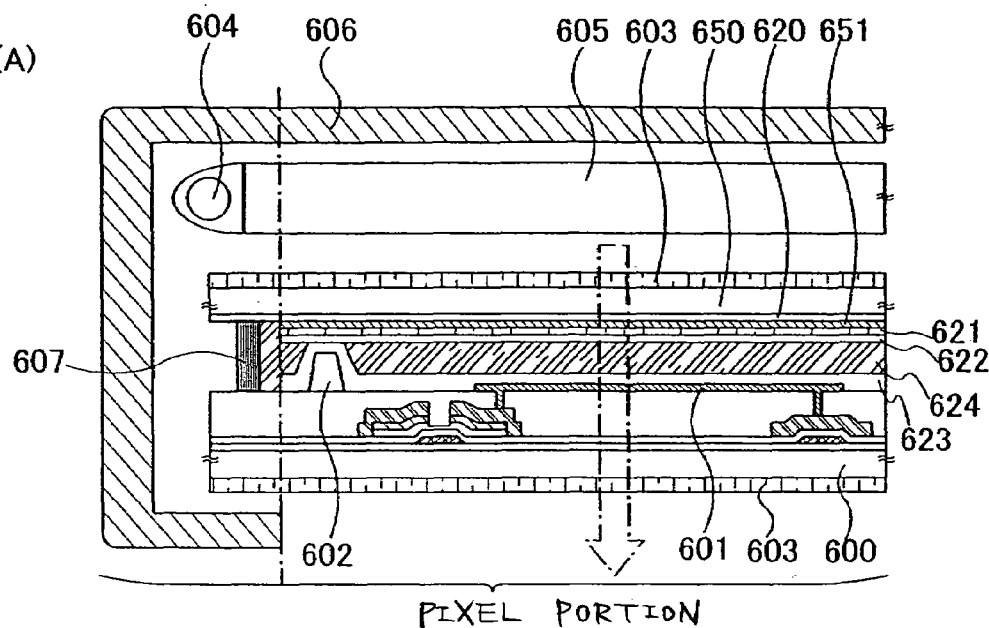
FIGS. 11(A) to 11(C) illustrate a liquid crystal display apparatus.
Figure 11:
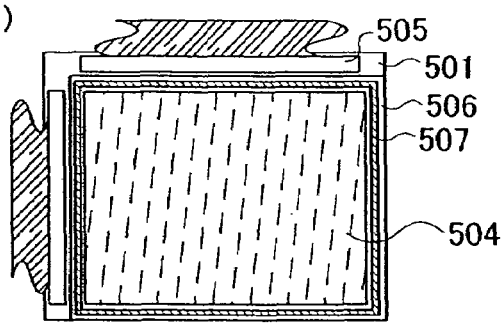
Figure 11:
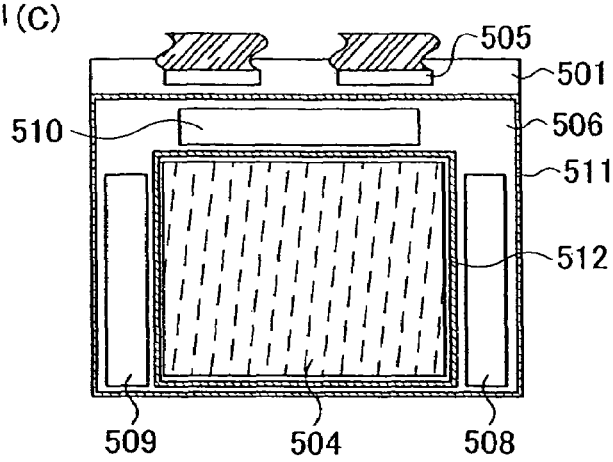

In this embodiment, a manufacturing process of a liquid crystal display apparatus of an active matrix type will be hereinafter described using FIG. 11.

First, an active matrix substrate is manufactured using a substrate 600 having translucency. As a substrate size of the substrate 600, it is preferable to use a large area substrate with a size of 600 mm×720 mm, 680 mm×880 mm, 1000 mm×1200 mm, 1100 mm×1250 mm, 1150 mm×1300 mm, 1500 mm×1800 mm, 1800 mm×2000 mm, 2000 mm×2100 mm, 2200 mm×2600 mm, or 2600 mm×3100 mm to reduce manufacturing cost. For example, a glass substrate of barium borosilicate glass or alumino-borosilicate glass, which is represented by #7059 glass or #1737 glass of Corning Inc. Moreover, as other substrates, translucent substrates such as a quartz substrate and a plastic substrate can be used.

Note that the active matrix substrate is equivalent to a substrate with an element such as a thin film transistor formed thereover.

Note that it is preferable to create a pixel pitch according to a design rule defining both a vertical length and a horizontal length as 50 to 750 μm.

First, using the sputtering method, after forming a conductive layer on the substrate 600 having an insulating surface entirely or in a selective manner, a resist mask is formed by the ink droplet jet method, and an unnecessary part is removed by etching to form wiring and electrodes (a gate electrode, a retention capacitor, terminals, etc.). Note that, if necessary, a base insulating film is formed on the substrate 600.

Note that, in the following processes, in a process in which etching treatment or ashing treatment for removing a resist is performed, the above-mentioned plasma treatment apparatus operating under the atmospheric pressure or a pressure close to the atmospheric pressure may be used. If the plasma treatment apparatus not requiring a complicated vacuum system is used, it becomes possible to reduce cost.

As a material for the wiring and the electrodes, an element selected out of Ti, Ta, W, Mo, Cr, and Nd, an alloy containing the elements, or a nitride containing the element as components may be used. Moreover, it is also possible to select two or more of the element selected out of Ti, Ta, W, Mo, Cr, and Nd, the alloy containing the element as a component, or the nitride containing the element as a component and stack the materials.

Note that when a screen size increases, lengths of respective pieces of wiring increase, and a problem occurs in that a wiring resistance increases to cause an increase in power consumption. Thus, in order to lower the wiring resistance to realize lower power consumption, Cu, Al, Ag, Au, Fe, Ni, and Pt or an alloy of these metals can be used as a material for the wiring and the electrodes.

Next, a gate insulating film is formed over the entire surface with the PCVD method. The gate insulating film is formed with a film thickness of 50 to 200 nm, and preferably with thickness of 150 nm using lamination of a silicon nitride film and a silicon oxide film. Note that the gate insulating film is not limited to the lamination, and an insulating film such as an silicon oxide film, a silicon nitride film, a silicon oxynitride film, or a tantalum oxide film can also be used.

Next, a first amorphous semiconductor film is formed over the entire surface of the gate insulating film with thickness of 50 to 200, and preferably 100 to 150 nm, by a publicly-known method such as the plasma CVD method and the sputtering method. Typically, an amorphous silicon (a-Si) film is formed with thickness of 100 nm. Note that a chamber is also increased in size when a film is formed on a large area substrate. In that case, treatment time increases in order to evacuate the inside of the chamber increased in size, and a large quantity of a film formation gas is also required. Therefore, it is advisable to perform formation of an amorphous silicon film using the plasma CVD apparatus that operates under the atmospheric pressure or a pressure close to the atmospheric pressure and has linear plasma supply means. Thus, it is possible to form the amorphous silicon film by scanning a few times. Moreover, a film only has to be formed in a desired place, which leads to a reduction in a film formation gas and makes it possible to reduce manufacturing cost.

Next, a second amorphous semiconductor film, which contains an impurity element of one conductivity type (N type or P type), is formed with thickness of 20 to 80 nm. The second amorphous semiconductor film containing an impurity element giving one conductivity type is formed over the entire surface with a publicly-known method such as the plasma CVD method or the sputtering method. In this embodiment, the second amorphous semiconductor film containing an N type impurity element is formed using a silicon target added with phosphorous.

Next, a resist mask is formed by the ink droplet jet method, and an unnecessary part is removed by etching to form a first amorphous semiconductor film of an island shape and a second amorphous semiconductor film of an island shape. As an etching method in this case, wet etching or dry etching is used.

Next, after forming a conducive layer covering the second amorphous semiconductor film of an island shape with the sputtering method, a resist mask is formed by the ink droplet jet method, and an unnecessary part is removed by etching to form wiring and electrodes (source wiring, a drain electrode, a capacitive electrode, etc.). As a material for the wiring and the electrodes, an element selected out of Al, Ti, Ta, W, Mo, Cr, Nd, Cu, Ag, Au, Cr, Fe, Ni, and Pt or an alloy of the elements may be used.

Next, the resist mask is formed by the ink droplet jet method, and the unnecessary part is removed by etching to form the source wiring, the drain electrode, and the capacitive electrode. In this case, wet etching or dry etching is used as an etching method. At this stage, a retention capacitor, which has an insulating film consisting of a material identical with a gate insulating film as a dielectric, is formed.

Then, a part of the second amorphous semiconductor film is removed in a self-aligning manner with the source wiring and the drain electrode as masks, and a part of the first amorphous semiconductor film is thinned. The thinned area becomes a channel formation area of a TFT.

Next, a protective film comprising a silicon nitride film with thickness of 150 nm and a first interlayer insulating film comprising a silicon oxide nitride film with thickness of 150 nm are formed over the entire surface. Note that, when a film is formed on a large area substrate, a chamber is also increased in size. In that case, treatment time increases in order to evacuate the inside of the chamber increased in size vacuum, and a large quantity of a film formation gas is also required. Therefore, it is advisable to form an amorphous silicon film using a plasma CVD apparatus having linear plasma supplying means. Thereafter, hydrogenation is performed, and a TFT of a channel etch type is manufactured.

Note that, although the example, in which a TFT structure is set as the channel etch type, is described in this embodiment, the TFT structure is not specifically limited, and a TFT of a channel stopper type, a TFT of a top gate type, or a TFT of a forward stagger type may be used.

Next, a resist mask is formed by the ink droplet jet method, and thereafter, a contact hole reaching the drain electrode and the capacitive electrode is formed by a dry etching process. In addition, it is also possible that a contact hole (not shown) for electrically connecting the gate wiring and terminal portions simultaneously is formed at a terminal portion, and metal wiring (not shown) connecting the gate wiring and the terminal portion electrically is formed. In addition, it is also possible that a contact hole (not shown) reaching the source wiring is formed simultaneously, and metal wiring to be connected to the source wiring is formed. After forming the metal wiring, a pixel electrode of ITO (indium tin oxide) or the like may be formed. Alternatively, after forming a pixel electrode of ITO or the like, the metal wiring may be formed.

Next, a transparent electrode film of ITO, $In_2O_3$—ZnO (indium oxide-zinc oxide alloy), ZnO (zinc oxide), or the like is formed with thickness of 110 nm. Thereafter, a process of forming a resist pattern with the ink droplet jet method and an etching process are performed to form a pixel electrode 601.

Through the above-mentioned processes, an active matrix substrate constituted by a pixel portion, which comprises a TFT of a reverse stagger type and a retention capacitor, and a terminal portion can be manufactured.

Subsequently, an orientation film 623 is formed on an active matrix substrate and rubbing treatment is carried out on the orientation film 623. Note that, in this embodiment, before forming the orientation film 623, a columnar spacer 602 for retaining a substrate interval is formed in a desired position by patterning an organic resin film such as an acrylic resin film. In addition, a spherical spacer may be spread over the entire surface of the substrate instead of the columnar spacer 602. The orientation film 623 may be formed by the ink droplet jet method.

Subsequently, an opposed substrate 650 is prepared. A color filter 602, in which a colored layer and a light-shielding layer are arranged in association with pixels, is provided in the opposed electrode 650. In addition, a smoothing film 651 covering this color filter 620 is provided. Subsequently, on the smoothing film 651, an opposed electrode 621 consisting of a transparent conductive film is formed in a position overlapping the pixel portion, an orientation film 622 is formed over the entire surface of the opposed substrate 650 to apply the rubbing treatment to the orientation film 622.

Then, after drawing a seal material 607 so as to surround the pixel portion on the active matrix substrate, liquid crystal is jetted to an area surrounded by the seal material 607 by the ink droplet jet method under decompression. Subsequently, the active matrix substrate and the opposed substrate 605 are adhered to each other by the seal material 607 under decompression without bringing the substrates into contact with the air. A filler (not shown) is mixed in the seal material 607, and the two substrates are adhered to each other keeping a uniform interval with this filler and the columnar spacer 602. By using the method of jetting liquid crystal with the ink droplet jet method, an amount of liquid crystal used in the manufacturing process can be reduced. In particular, in the case in which a large area substrate is used, significant cost reduction can be realized.

In this way, an active matrix liquid crystal display apparatus is completed. Then, if necessary, the active matrix substrate or the opposed substrate is divided into desired shapes. Moreover, an optical film such as a polarizing plate 603 or the like is provided properly using a publicly-known technique. Then, an FPC is adhered using a publicly-known technique.

If a backlight 604 and a light guide plate 605 are provided in a liquid crystal module, which is obtained by the above-mentioned processes, and covered by a cover 606, an active matrix liquid crystal display apparatus (transmission type), a part of a sectional view of which is shown in FIG. 11(A), is completed. Note that the cover and the liquid crystal module are fixed using an adhesive or organic resin. In addition, since the active matrix liquid crystal display apparatus is a transmission type, the polarizing plate 603 is adhered to both the active matrix substrate and the opposed substrate.

In addition, although this embodiment indicates the example of the transmission type, the present invention is not specifically limited and liquid crystal display apparatus of a reflection type and a semi-transmission type can also be manufactured. In the case in which a reflective type liquid crystal display apparatus is obtained, a metal film with a high light reflectivity, representatively a material film containing aluminum or silver as main components, or a laminated film of the materials only have to be used.

Subsequently, a top view of the liquid crystal module is shown in FIG. 11(B), and a top view of a liquid crystal module different from FIG. 11(B) is shown in FIG. 11(C).

A TFT, in which an active layer is formed of the amorphous semiconductor film obtained by the embodiment, is small in a field effect mobility and can obtain only 1 $cm^2$/Vsec. Therefore, a drive circuit for performing image display is formed of an IC chip and is implemented by a TAB (Tape Automated Bonding) system or a COG (Chip on glass) system.

In FIG. 11(B), reference numeral 501 denotes an active matrix substrate; 506 denotes an opposed substrate; 504 denotes a display portion; 505 denotes an FPC; and 507 denotes a seal material. In this embodiment, liquid crystal is jetted by the ink droplet jet method, and the pair of substrates 501 and 506 are adhered to each other by the seal material 507.

A TFT obtained by this embodiment is small in field effect mobility. However, in the case in which the TFT is produced in mass production using a large area substrate, cost for a manufacturing process can be reduced. In the case in which liquid crystal is jetted by the ink droplet jet method, and the pair of substrates are adhered to each other, the liquid crystal can be held between the pair of substrates without regard to a substrate size. Thus, a display apparatus provided with a liquid crystal panel having a large screen of 20 to 80 inches can be manufactured.

In addition, in the case in which a semiconductor film having a crystal structure obtained by performing publicly-known crystallization treatment to crystallize an amorphous semiconductor film, representatively, an active layer is constituted by a polysilicon layer, since a TFT with high field effect mobility is obtained, not only the pixel portion but also a drive circuit having a CMOS circuit can be manufactured on the identical substrate. A CPU or the like can be manufactured on the identical substrate in addition to the drive circuit. In the case in which a TFT having an active layer consisting of a polysilicon film is used, a liquid crystal module as in FIG. 11(C) can be manufactured. In FIG. 11(C), reference numeral 501 denotes an active matrix substrate; 505 denotes an FPC; 506 denotes an opposed electrode; 510 denotes a source driver; 508 and 509 denote gate drivers; 504 denotes a pixel portion; 511 denotes a first seal material; and 512 denotes a second seal member. In this embodiment, liquid crystal is jetted by the ink droplet jet method, and the pair of substrates 501 and 506 are adhered to each other by the first seal material 512 and the second seal material 506. Note that, since liquid crystal is unnecessary for the drivers 508 to 510, liquid crystal is retained only in the display portion 504, and the second seal material 511 is provided for reinforcement of an entire panel.

Note that, although the example in which the invention is applied to a display panel using a liquid crystal display element is described here, the invention may be applied to a display panel using a light-emitting element. The light emitting element has a structure in which an electroluminescent layer (actually, various kinds of layers such as an electron transport layer are present, the layers are generally referred to as electroluminescent layer here) is sandwiched by the pair of electrodes. A method of manufacturing this electroluminescent layer with the ink droplet jet method (e.g., ink jet method) has already been put to practical use. In other words, if a compound to be jetted from a head is changed or the head filled with a compound is replaced, consecutive treatment becomes possible. In addition, since the light-emitting element is a selfluminous flat display, the light-emitting element does not require a backlight and is not limited in terms of a view angle. Moreover, the light-emitting element is excellent in contrast and response speed remarkably. Therefore, it is possible to use the light-emitting element not only as a portable terminal but also as a large display apparatus.

It is possible to combine the embodiment with the above-mentioned embodiment modes and embodiments freely.

[Embodiment 5]

An embodiment of the invention will be explained using the drawings. In this embodiment, a process of manufacturing a thin film transistor and a capacitive element using the invention will be explained. Sectional views of the manufacturing process are shown in FIGS. 13 and 14, and a top view thereof is shown in FIG. 15.

Figure 13A:
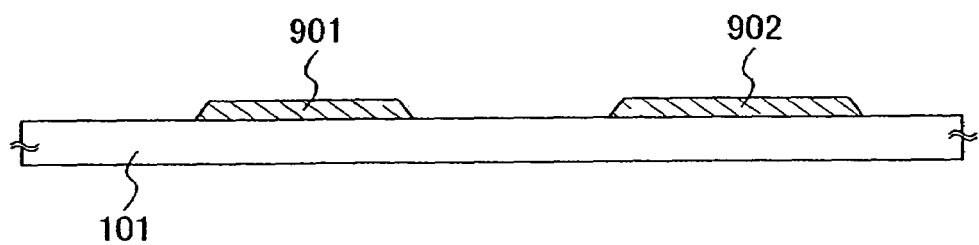
FIGS. 13(A) to 13(D) illustrate a manufacturing method for a thin film transistor.
Figure 14:
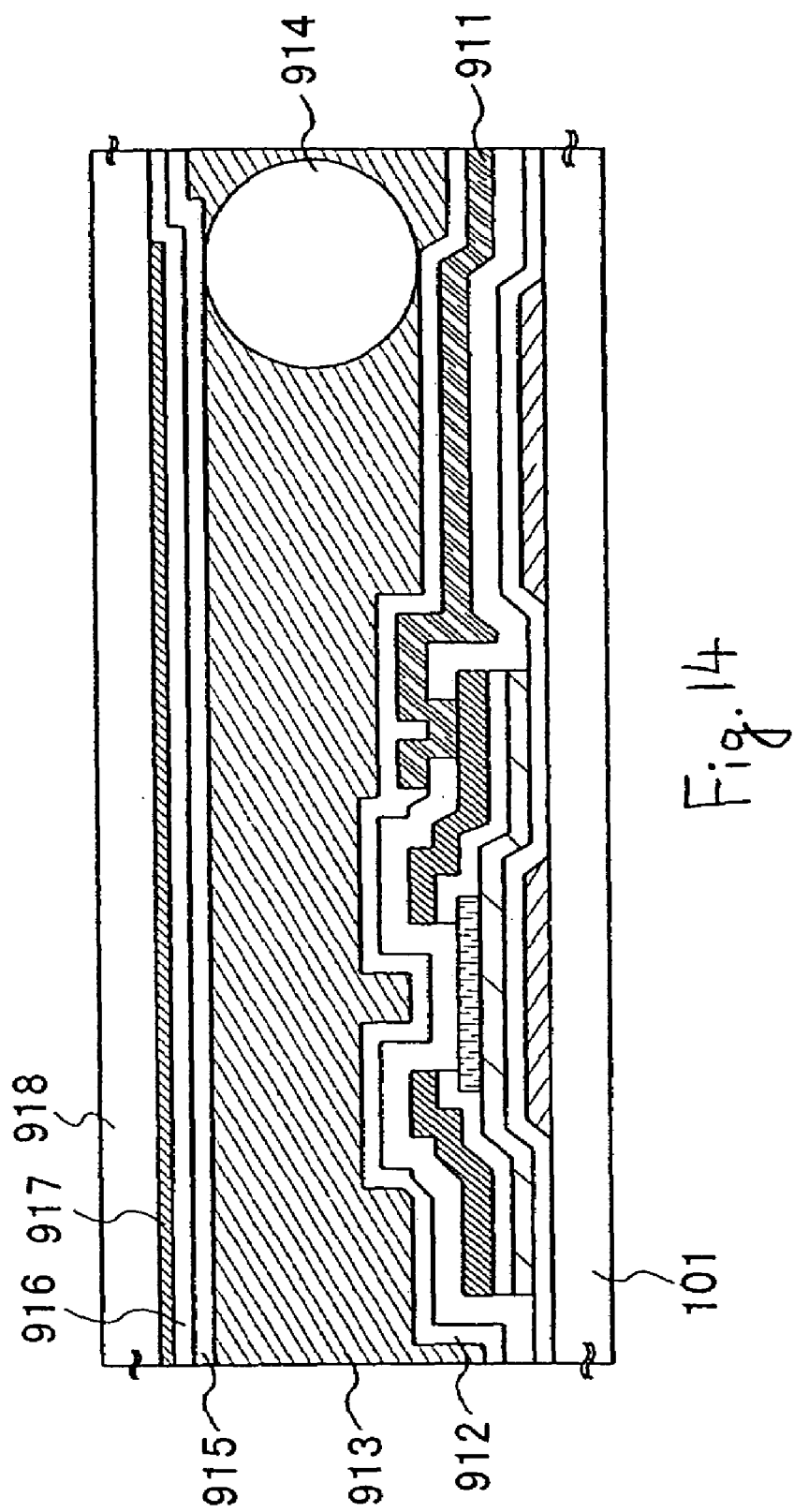
FIG. 14 is a diagram showing a sectional structure of the thin film transistor.
Figure 15A:
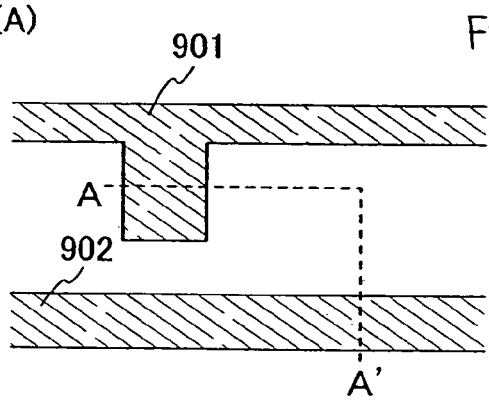
FIGS. 15(A) to 15(E) are top views of the thin film transistor.

A gate electrode (gate wiring) 901 and a capacitive electrode (capacitive wiring) 902 are formed over the substrate 101 (FIG. 13(A), FIG. 15A). A transparent substrate made of glass, plastics, or the like is used as the substrate 101. In addition, the gate electrode 901 and the capacitive electrode 902 are formed of an identical layer. After stacking aluminum (Al) containing neodymium (Nd) or the like and molybdenum (Mo), selective processing is performed locally. In this embodiment, since the selective processing is performed, a photolithography process using a photo mask is unnecessary, and a manufacturing process can be simplified significantly. Note that, as a material of the gate electrode 901 and the capacitive electrode 902, other than aluminum (Al) containing neodymium (Nd) or the like, a material having conductivity such as chrome (Cr) may be used.

Figure 13B:
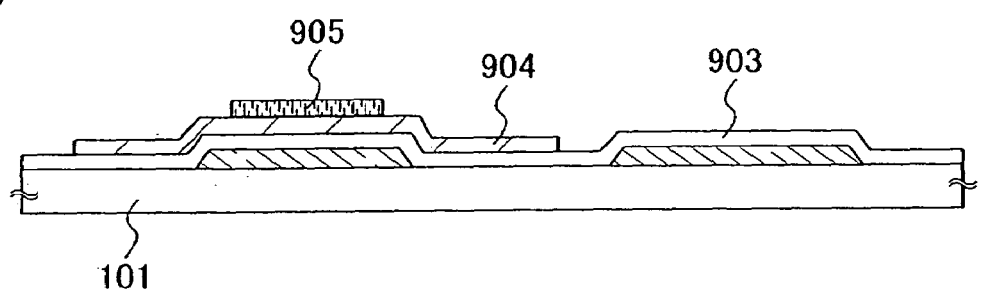
Figure 15D:
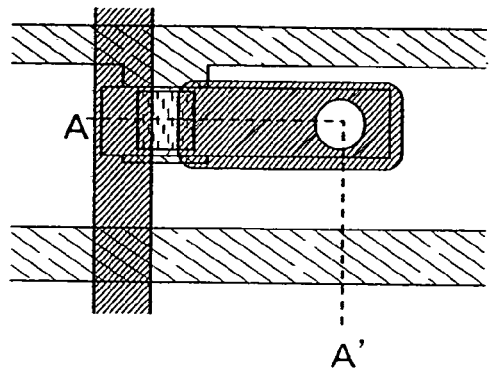
Figure 15B:
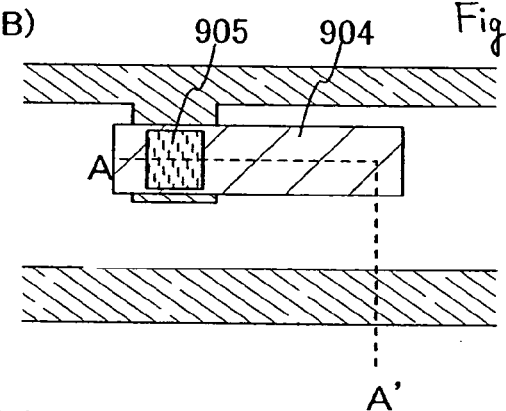

Next, an insulating film (gate insulating film) 903 covering the gate electrode 901 and the capacitive electrode 902 is formed (FIG. 13(B), FIG. 15(B)). As the insulating film 903, an insulating film such as silicon nitride film or a silicon oxide film, or a film obtained by stacking the silicon nitride film, the silicon oxide film, and the like are used.

Subsequently, a semiconductor film 904 having an amorphous structure is formed on the insulating film 903 by performing selective processing locally. In this embodiment, since the selective processing is performed, a photolithography process using a photo mask is unnecessary, and a manufacturing process can be simplified significantly.

Next, a protective film 905 is formed on a part to be a channel area for a TFT in the semiconductor film 904. The protective film 905 is formed by subjecting an insulating film such as a silicon nitride film to the selective processing locally.

Figure 13C:
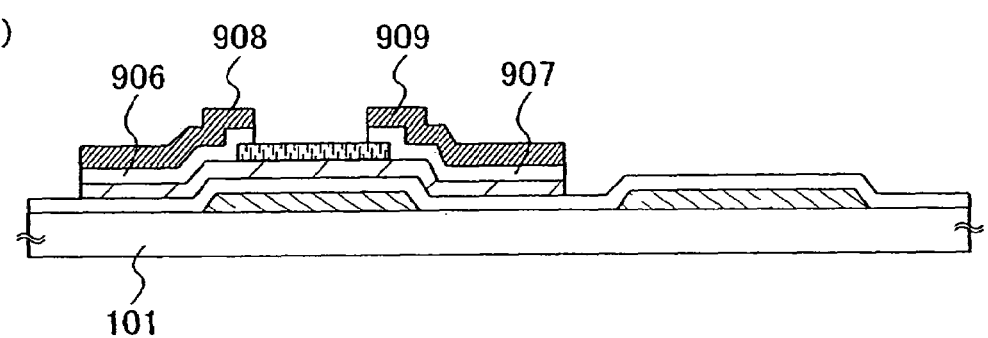
Figure 15E:
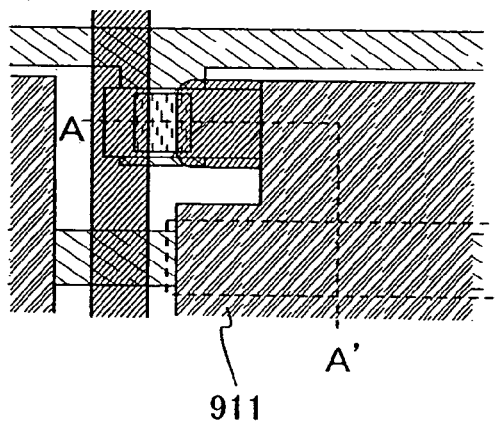
Figure 15C:
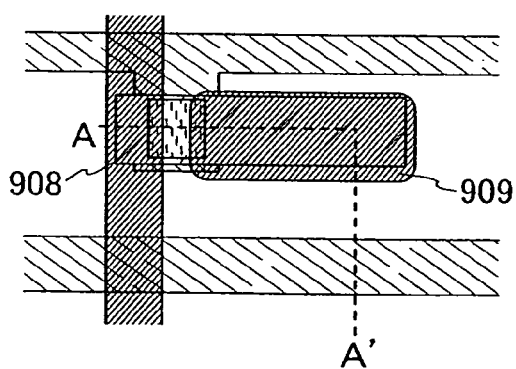

Subsequently, an amorphous semiconductor is formed, and thereafter, phosphorous, which is an impurity element, is added to form an N type semiconductor film (FIG. 13(C), FIG. 15(C)). Then, conductive films 908 and 909, in which molybdenum (Mo), aluminum (Al), and molybdenum (Mo) are stacked in order, are formed by performing selective processing locally. Then, the N type semiconductor layer is etched with the conductive films 908 and 909 as masks to form N type semiconductor layers 906 and 907.

Figure 13D:
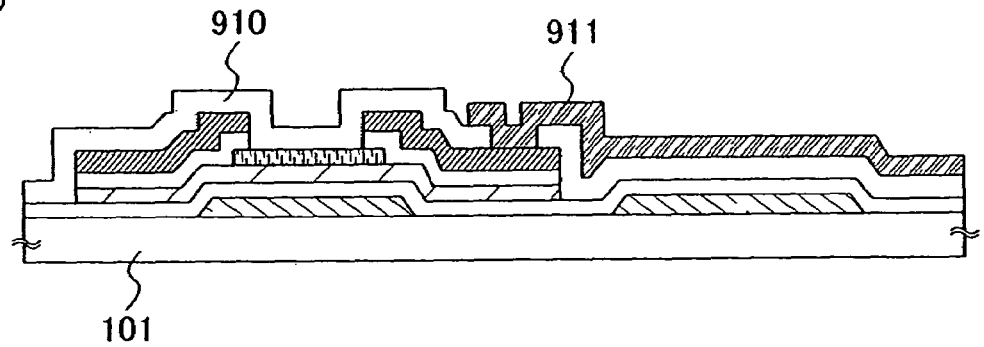

Next, a dielectric film 910 consisting of a silicon nitride film or a silicon oxide film is formed over the entire surface of the conductive films 908 and 909 (FIG. 13(D), FIG. 15(D)). Subsequently, a contact hole piercing through the dielectric film 910 to reach the wiring 909 is formed. In this embodiment, the contact hole is formed using the method described in the second embodiment.

Subsequently, a pixel electrode 911 is formed by subjecting a transparent conductive film such as an ITO to selective processing locally (FIG. 15(E)).

Next, an orientation film 912 is formed on the pixel electrode 911 (FIG. 14). Subsequently, after adhering an opposed substrate 918, in which the orientation film 915, the opposed electrode 916, and the light-shielding film 917 are formed, to the orientation film 912, a liquid crystal material 913 is injected to complete a display panel. A gap between the substrate 101 and the opposed substrate 918 is retained by the spacer 914.

Note that, the above-mentioned manufacturing process indicates the case in which a photolithography process using a photo mask is made unnecessary by performing the selective processing locally in all the processes. In addition, in this embodiment, a manufacturing process for a TFT of a so-called channel stop type is shown in the figure. However, the invention may be applied to a manufacturing process for a TFT of a channel etch type.

A transistor and a capacitive element can be formed through the above-mentioned processes. According to this embodiment, since the transistor and the capacitive element can be manufactured without using the photolithography process, a significant reduction in the manufacturing process can be realized, and a reduction in manufacturing cost can be realized.

[Sixth Embodiment]

In this embodiment, an example of a manufacturing procedure for a light-emitting apparatus having an EL element will be explained using FIG. 16.

In a light-emitting mechanism for an EL element, it is said that, a voltage is applied with an organic compound layer sandwiched between a pair of electrodes, whereby an electron injected from a cathode consisting of a material with a small work function and a hole injected from an anode are recombined in a light-emitting center in an organic compound layer to form a molecule exciton, and the molecule exciton discharges energy and emits light when returning to a ground state. Single excitation and triple excitation are known as an excitation state, and it is considered that light emission is possible through both the excitation states.

In a light-emitting apparatus that is formed by arranging such EL elements in a matrix shape, it is possible to use drive methods such as passive matrix drive (passive matrix type) and active matrix drive (active matrix type) in which a switch is provided for each pixel (or dot).

Here, an example in which only an EL element is manufactured will be hereinafter explained.

First, in the case in which a light-emitting apparatus of an active matrix type is manufactured, a TFT (not shown) is manufactured on a substrate 150 having a dielectric surface. As the TFT, an N type TFT or a P type TFT only has to be manufactured by a publicly-known method. Subsequently, a first electrode 151 to be an anode is formed so as to overlap an electrode (not shown) of the TFT partially. Here, the first electrode 151 is formed by the ink jet method using a conductive film material (ITO, $In_2O_3$—ZnO, ZnO, etc.) with a large work function.

Figure 16A:
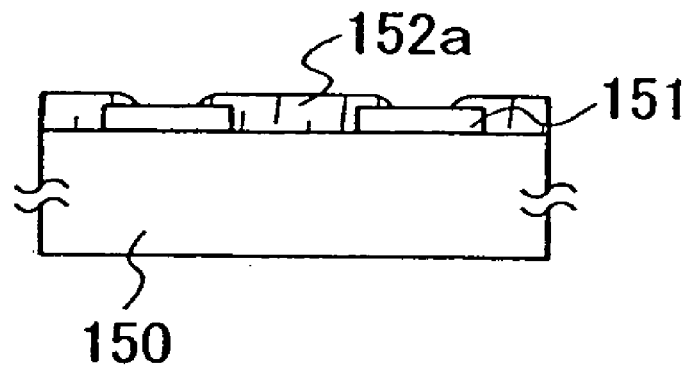
FIGS. 16(A) to 16(C) illustrate a manufacturing method for a display apparatus.

Subsequently, a solution containing a dielectric material is jetted in a selective manner by the ink jet method to form a partition wall (which is called a bank, a dielectric object, a barrier, an embankment, etc.) 152a (FIG. 16(A)). The partition wall 152a covers an end of the first electrode 151, wiring, and electrodes and insulates the electrodes from each other. As a material of the partition wall 152a, a photosensitive or non-photosensitive organic material (polyimide, acrylic, polyamide, polyimide-amide, resist, or benzocyclobutene), which is obtained by the application method or a laminated body of these materials can be used appropriately. In addition, as the partition wall 152a, both a negative type that is made insoluble with respect to an etchant and a positive type that is made soluble with respect to the etchant by light can be used.

Figure 16B:
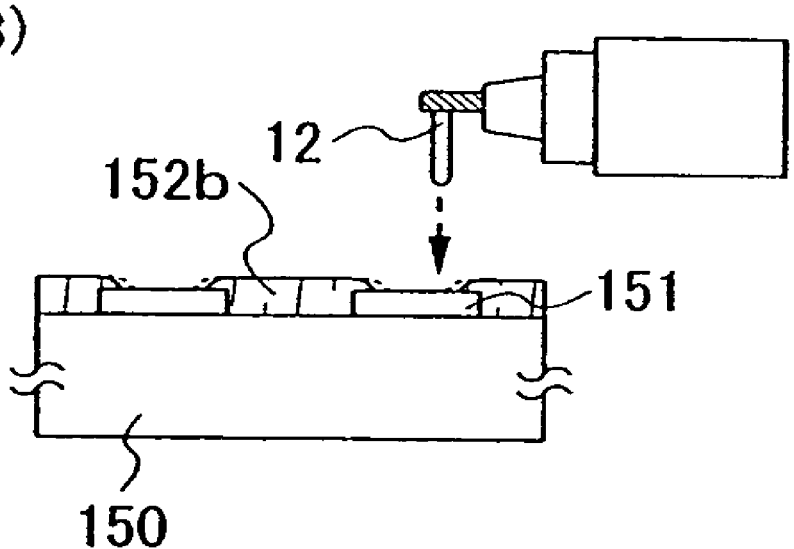
Figure 16C:
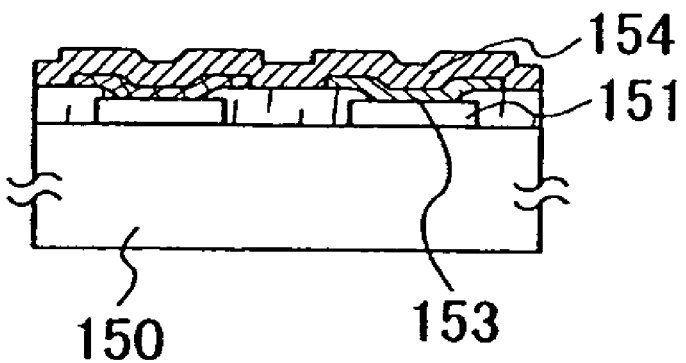

Subsequently, the plasma treatment is performed in a selective manner using the nozzle 12 (FIG. 16(B)). A shape of the partition wall is adjusted by this plasma treatment such that a curved surface having a curvature (curvature radius (0.2 μm to 3 μm)) is formed at an upper end or a lower end of the partition wall 152b. In the case in which the shape of the partition wall is adjusted by $O_2$ plasma, it is preferable to also perform surface modification with $O_2$ plasma because the total number of processes does not increase.

Subsequently, a layer 153, which contains an organic compound by the ink jet method, is formed in a selective manner on the first electrode (anode) 151. If layers containing organic objects, from which light emission of R, G, and B can be obtained, are formed in a selective manner, respectively, whereby a full color display can be obtained. Moreover, a second electrode (cathode) 154 is formed on a layer 153 containing an organic compound (FIG. 16(C)). It is preferable to form the second electrode (cathode) with the ink jet method as well. The cathode only has to be formed using a material with a small work function (Al, Ag, Li, Ca, or an alloy of these metals such as MgAg, MgIn, AlLi, $CaF_2$, or CaN). In this way, an EL element consisting of the first electrode (anode) 151, the layer 153 containing an organic compound, and a second electrode (cathode) 154 is formed.

Subsequently, a protective film (not shown) is provided to seal a light-emitting element, or the light-emitting element is closed by a sealing substrate (not shown) or a sealing can (not shown). By sealing the light-emitting element, the light-emitting element can be completely blocked from the outside, and a material facilitating deterioration of an organic compound layer such as moisture or oxygen can be prevented from entering from the outside.

In addition, this embodiment indicates the example with a structure in which a layer containing an organic compound is formed on an anode, a light-emitting element with a cathode formed on an organic compound layer is provided, and light emission, which has occurred in the layer containing the organic compound, is extracted from the anode serving as a transparent electrode to the TFT (hereinafter referred to as a lower surface emission structure). However, it is also possible that a structure is adopted in which a layer containing an organic compound is formed on an anode, and a cathode serving as a transparent electrode is formed on a layer containing an organic compound (hereinafter referred to as an upper surface emission structure).

[Seventh Embodiment]

Various electric appliances can be completed using the invention. Specific examples thereof will be explained using FIG. 12.

Figure 12A:
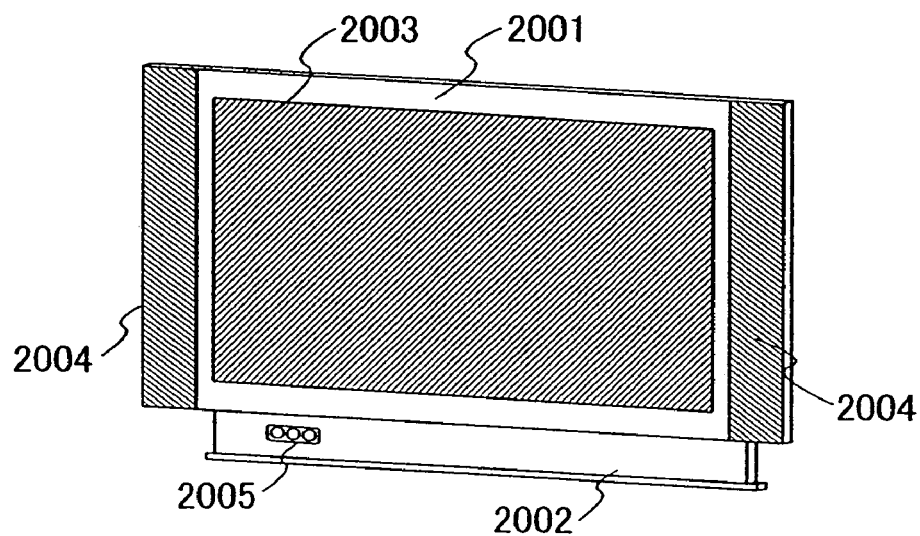
FIGS. 12(A) to 12(C) illustrate electronic devices.

FIG. 12(A) is a display apparatus (which is also referred to as a television set and a television receiver) having a large display portion of, for example, 20 to 80 inches and includes a housing 2001, a support stand 2002, a display portion 2003, speaker portions 2004, a video input terminal 2005, and the like. The invention is applied to manufacturing of the display portion 2003. It is preferable to manufacture such a large display apparatus using a large substrate of a meter angle like a fifth generation (1000×1200 millimeters) and a sixth generation (1400×1600 millimeters) in terms of productivity and cost.

Figure 12B:
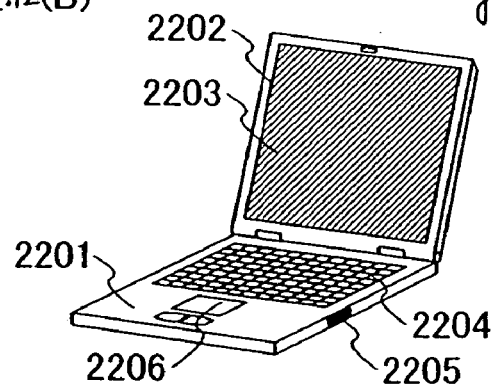

FIG. 12(B) is a notebook personal computer, which includes a main body 2201, a housing 2202, a display portion 2203, a keyboard 2204, an external connection port 2205, a pointing mouse 2206. The invention is applied to manufacturing of the display portion 2203.

Figure 12C:
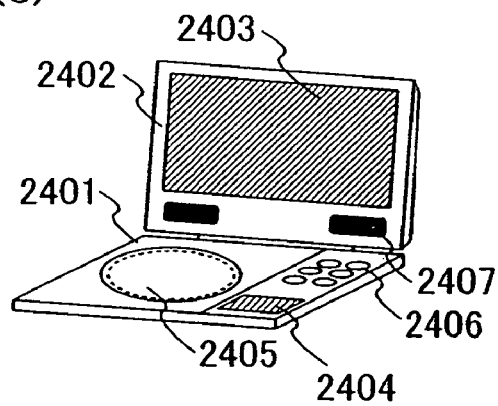

FIG. 12(C) is a portable image reproducing apparatus provided with a recording medium (specifically, a DVD reproduction apparatus) and includes a main body 2401, a housing 2402, a display portion A2403, a display portion B2404, a recording medium (DVD, etc.) reading portion 2405, an operation key 2406, a speaker portion 2407, and the like. The display portion A2403 mainly displays image information, and the display portion B2404 mainly displays character information. However, the invention is applied to manufacturing of the display portion A2403 and A2404.

As described above, the range of application of the invention is extremely large, and the invention can be applied to manufacturing of electric appliances in all fields. In addition, the invention can be combined with the above-mentioned embodiment modes and the embodiments.

[Eighth Embodiment]

An embodiment of the invention will be explained. More specifically, a manufacturing process for a thin film transistor to which the present invention is applied will be explained using FIGS. 21 to 23.

Figure 21A:
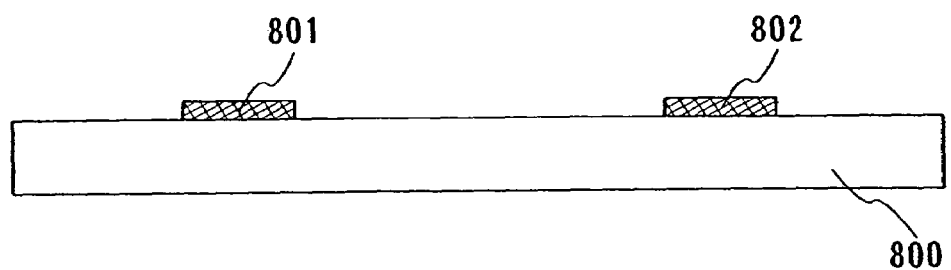
FIGS. 21(A) to 21(D) illustrate a manufacturing method for a thin film transistor.
Figure 21B:
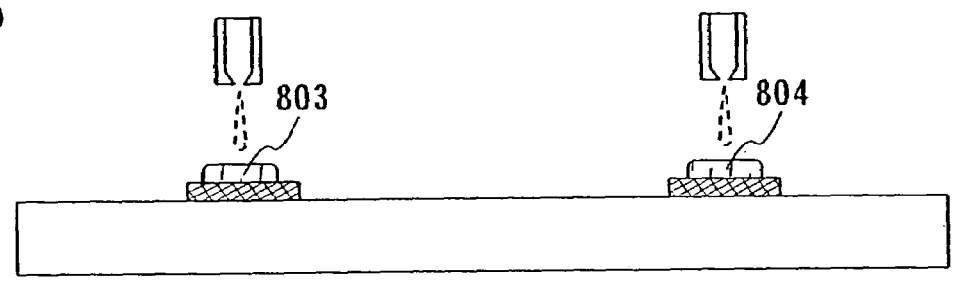
Figure 21C:
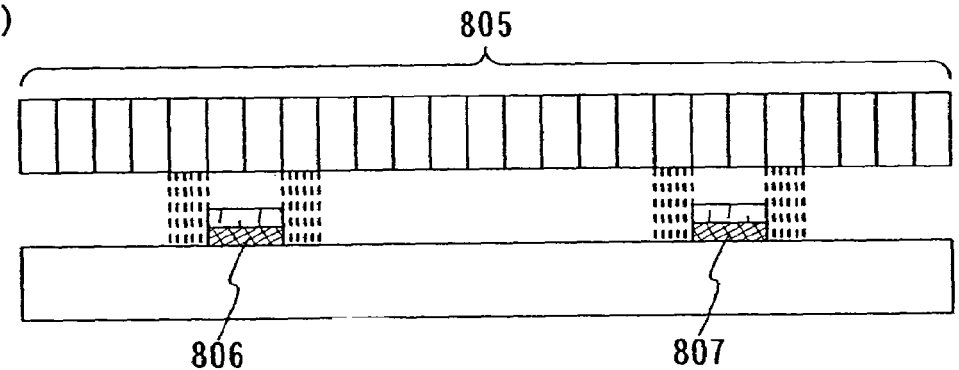
Figure 21D:
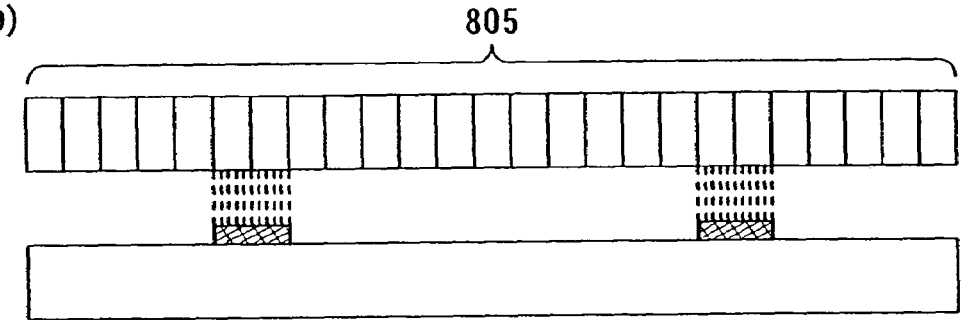
Figure 22A:
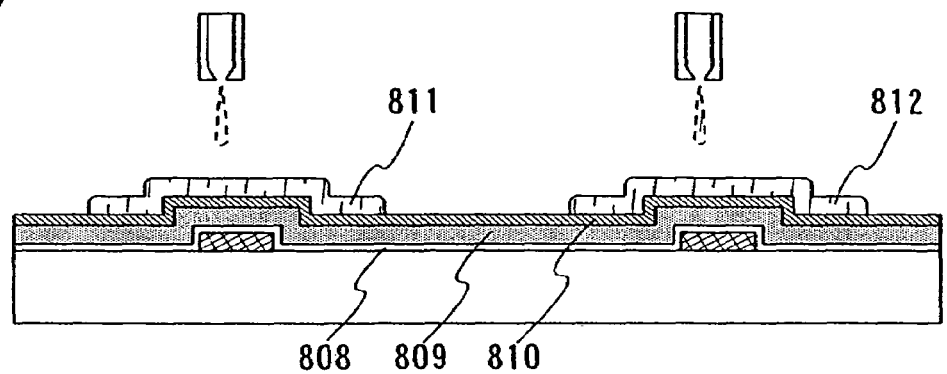
FIGS. 22(A) to 22(C) illustrate the manufacturing method for a thin film transistor.
Figure 22B:
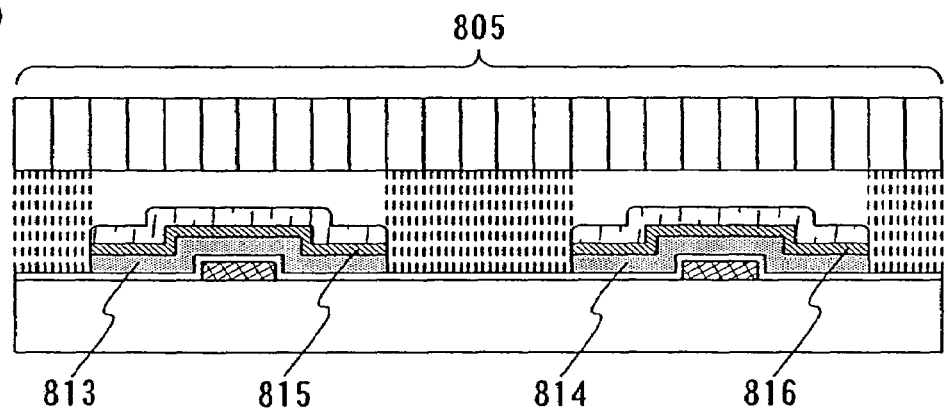
Figure 22C:
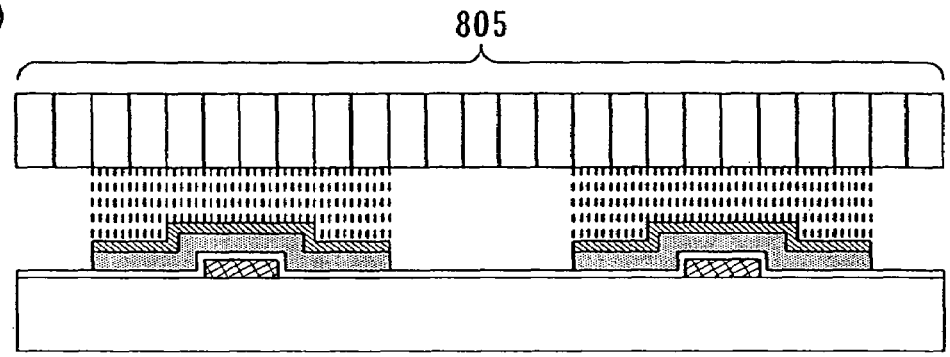

Conductive layers 801 and 802 are formed on a substrate 800 consisting of quartz, organic resin, or the like in a selective manner by a CVD method, an evaporation method, or a sputtering method (see FIG. 21(A)). Next, dielectric layers 803 and 804 functioning as masks are formed on the conductive layers 801 and 802 by an ink droplet jet method (see FIG. 21(B)). In other words, a compound containing a dielectric is discharged to form the dielectric layers 803 and 804. Subsequently, under the atmospheric pressure or a pressure close to the atmospheric pressure, the conductive layers 803 and 804 are etched by the plasma generating means 805 with the dielectric layers 803 and 804 as masks to form the conductive layers 806 and 807 (see FIG. 21(C)). Next, the dielectric layers 803 and 804 are ashed by the plasma generating means 805 under the atmospheric pressure or a pressure close to the atmospheric pressure (see FIG. 21(D)). In other words, the dielectric layer 805 is removed.

Thereafter, a dielectric layer 808 functioning as a gate dielectric film, a semiconductor layer 809, and a semiconductor layer 810, to which a one conductivity type is given, are stacked and formed on the substrate 800 so as to be in contact with the conductive layers 806 and 807 (see FIG. 2(A)). Next, dielectric layers 811 and 812 functioning as masks are formed on the semiconductor layer 810 by the ink droplet jet method. Subsequently, under the atmospheric pressure or a pressure close to the atmospheric pressure, the semiconductor layers 809 and 810 are etched by the plasma generating means 805 with the dielectric layers 811 and 812 as masks to form semiconductor layers 813 and 816 (see FIG. 22(B)). Next, the dielectric layers 811 and 812 are ashed by the plasma generating means 805 under the atmospheric pressure or a pressure close to the atmospheric pressure. In other words, the dielectric layers 811 and 812 are removed.

Figure 23A:
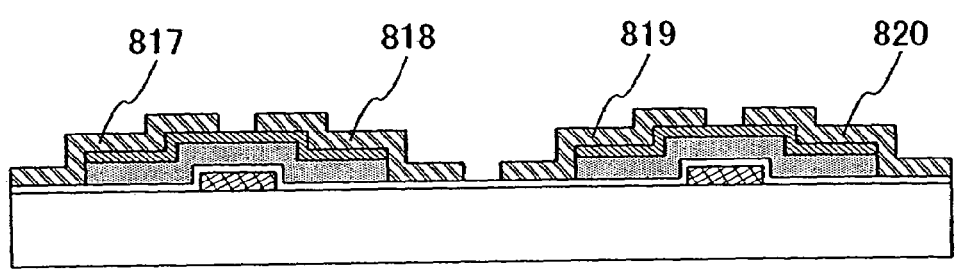
FIGS. 23(A) and 23(B) illustrate the manufacturing method for a thin film transistor.
Figure 23B:
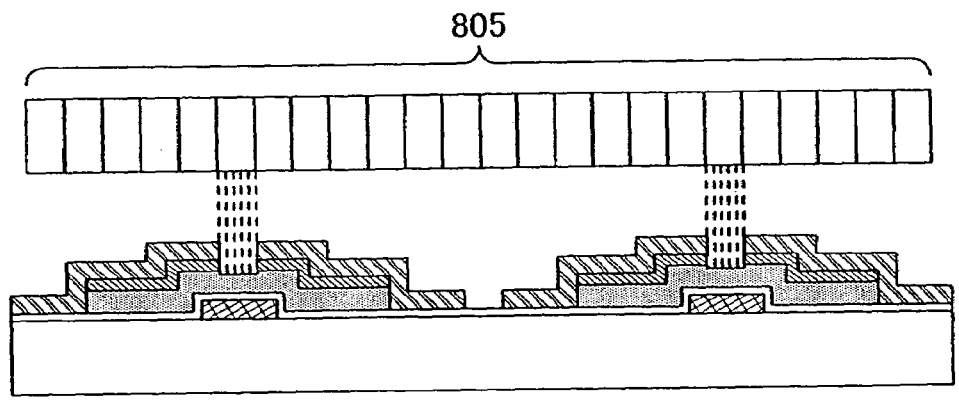

Next, conductive layers 817 to 820 are formed on the substrate 800 in a selective manner by the CVD method, the evaporation method, or the sputtering method so as to be in contact with the semiconductor layers 815 and 816 (see FIG. 23(A)). Subsequently, the semiconductor layers 815 and 816 are etched with the conductive layers 817 to 820 as masks under the atmospheric pressure or a pressure close to the atmospheric pressure (see FIG. 23(A)). In this case, as shown in the figure, the semiconductor layers 813 and 814 are slightly etched. A thin film transistor of a channel etch type is completed through the above-mentioned processes. This thin film transistor can use display means and storing means as components.

The invention is characterized by the following four points. First, conductive layers are formed in a selective manner by the CVD method, the evaporation method, or the sputtering method; second, dielectric layers functioning as resist masks are formed by the ink droplet jet method; third, the dielectric layers, semiconductor layers, and the conductive layers are etched by the plasma generating means under the atmospheric pressure or a pressure close to the atmospheric pressure; fourth, the dielectric layers functioning as resist masks are ashed by the plasma generating means under the atmospheric pressure or a pressure close to the atmospheric pressure.

Efficiency in use of a material is improved according to the first characteristic that conductive layers are formed on a substrate in a selective manner without forming conductive layers over the entire surface of the substrate. Similarly, efficiency in use of a material is improved according to the second characteristic that resist masks are formed on a substrate in a selective manner without being forming over the entire surface of the substrate. Therefore, a significant reduction of manufacturing cost is realized by the first and the second characteristics. In addition, since vacuum equipment is unnecessary, a reduction in a manufacturing time and a reduction of manufacturing cost are realized according to the third and the fourth characteristics. Moreover, the first and the second electrodes are provided as the plasma generating means, the first electrode surrounds the periphery of the second electrode, and in the case in which plural cylindrical electrodes arranged in one axial direction, which have nozzle-like supply ports for the gas at tips thereof, is used, since the gas only has to be supplied in a selective manner, improvement of efficiency in use of the gas is realized.

The invention claimed is:

1. A manufacturing method for wiring, comprising:
forming a first conductive layer and a second conductive layer over a substrate having a dielectric surface in a selective manner with a CVD method, an evaporation method, or a sputtering method;
discharging a compound to selectively form a first resist layer over the first conductive layer and to selectively form a second resist layer over the second conductive layer wherein the first resist layer comprises a first resist mask selectively provided over the first conductive layer and wherein the second resist layer comprises a second resist mask selectively provided over the second conductive layer;
etching the first conductive layer and the second conductive layer with plasma generating means using the first resist mask and the second resist mask under an atmospheric pressure or a pressure close to the atmospheric pressure; and
ashing the first resist mask and the second resist mask with the plasma generating means under the atmospheric pressure or a pressure close to the atmospheric pressure.

2. A manufacturing method for wiring, comprising:
forming a first conductive layer and a second conductive layer over a substrate having a dielectric surface in a selective manner with a CVD method, an evaporation method, or a sputtering method;
discharging a compound to selectively form a first resist layer over the first conductive layer and to selectively form a second resist layer over the second conductive layer wherein the first resist layer comprises a first resist mask selectively provided over the first conductive layer and wherein the second resist layer comprises a second resist mask selectively provided over the second conductive layer;
irradiating an ultraviolet ray on the first resist layer and the second resist layer via a photo mask;
etching the first conductive layer and the second conductive layer with plasma generating means using the first resist mask and the second resist mask, under an atmospheric pressure or a pressure close to the atmospheric pressure; and
ashing the first resist mask and the second resist mask with the plasma generating means under the atmospheric pressure or a pressure close to the atmospheric pressure.

3. A manufacturing method for wiring according to claim 1 or 2, wherein the first conductive layer and the second conductive layer are formed using a metal mask in a selective manner.

4. A manufacturing method for wiring according to claim 1 or 2, wherein the compound contains a photosensitive agent.

5. A manufacturing method for wiring according to claim 1 or 2, wherein the plasma generating means has first and second electrodes, and the first electrode surrounds the periphery of the second electrode and has a cylindrical shape having a nozzle-like supply port for the gas at tips thereof.

6. A manufacturing method for wiring according to claim 1 or 2, wherein the plasma generating means has first and second electrodes, gas supplying means that introduces a gas between the first and the second electrodes, and a power supply that applies a voltage to the first or the second electrodes.

7. A manufacturing method for a display device, comprising:
forming a first conductive layer and a second conductive layer over a substrate having a dielectric surface in a selective manner with a CVD method, an evaporation method, or a sputtering method;
discharging a compound to selectively form a first resist layer over the first conductive layer and to selectively form a second resist layer over the second conductive layer wherein the first resist layer comprises a first resist mask selectively provided over the first conductive layer and wherein the second resist layer comprises a second resist mask selectively provided over the second conductive layer;
etching the first conductive layer and the second conductive layer with plasma generating means using the first resist mask and the second resist mask under an atmospheric pressure or a pressure close to the atmospheric pressure; and
ashing the first resist mask and the second resist mask with the plasma generating means under the atmospheric pressure or a pressure close to the atmospheric pressure.

8. A manufacturing method for a display device according to claim 7, wherein the first conductive layer and the second conductive layer are formed using a metal mask in a selective manner.

9. A manufacturing method for a display device according to claim 7, wherein the compound contains a photosensitive agent.

10. A manufacturing method for a display device according to claim 7, wherein the plasma generating means has first and second electrodes, and the first electrode surrounds the periphery of the second electrode and has a cylindrical shape having a nozzle-like supply port for the gas at tips thereof.

11. A manufacturing method for a display device according to claim 7, wherein the plasma generating means has first and second electrodes, gas supplying means that introduces a gas between the first and the second electrodes, and a power supply that applies a voltage to the first or the second electrodes.

12. A manufacturing method for a display device, comprising:
forming a first conductive layer and a second conductive layer over a substrate having a dielectric surface in a selective manner with a CVD method, an evaporation method, or a sputtering method;
discharging a compound to selectively form a first resist layer over the first conductive layer and to selectively form a second resist layer over the second conductive layer wherein the first resist layer comprises a first resist mask selectively provided over the first conductive layer and wherein the second resist layer comprises a second resist mask selectively provided over the second conductive layer;
irradiating an ultraviolet ray on the first resist layer and the second resist layer via a photo mask;
etching the first conductive layer and the second conductive layer with plasma generating means using the first resist mask and the second resist mask, under an atmospheric pressure or a pressure close to the atmospheric pressure; and
ashing the first resist mask and the second resist mask with the plasma generating means under the atmospheric pressure or a pressure close to the atmospheric pressure.

13. A manufacturing method for a display device according to claim 12, wherein the first conductive layer and the second conductive layer are formed using a metal mask in a selective manner.

14. A manufacturing method for a display device according to claim 12, wherein the compound contains a photosensitive agent.

15. A manufacturing method for a display device according to claim 12, wherein the plasma generating means has first and second electrodes, and the first electrode surrounds the periphery of the second electrode and has a cylindrical shape having a nozzle-like supply port for the gas at tips thereof.

16. A manufacturing method for a display device according to claim 12, wherein the plasma generating means has first and second electrodes, gas supplying means tat introduces a gas between the first and the second electrodes, and a power supply that applies a voltage to the first or the second electrodes.

17. A manufacturing method for wiring, comprising:
forming a first conductive layer and a second conductive layer over a substrate having a dielectric surface in a selective manner with a CVD method, an evaporation method, or a sputtering method;
discharging a compound from a nozzle to selectively form a first resist layer over the first conductive layer and to selectively form a second resist layer over the second conductive layer wherein the first resist layer comprises a first resist mask selectively provided over the first conductive layer and wherein the second resist layer comprises a second resist mask selectively provided over the second conductive layer;
scanning the substrate during the discharging of the compound;
etching the first conductive layer and the second conductive layer with plasma generating means using the first resist mask and the second resist mask under an atmospheric pressure or a pressure close to the atmospheric pressure; and
ashing the first resist mask and the second resist mask with the plasma generating means under the atmospheric pressure or a pressure close to the atmospheric pressure.

18. A manufacturing method for wiring according to claim 17, wherein the first conductive layer and the second conductive layer are formed using a metal mask in a selective manner.

19. A manufacturing method for wiring according to claim 17, wherein the plasma generating means has first and second electrodes, and the first electrode surrounds the periphery of the second electrode and has a cylindrical shape having a nozzle-like supply port for the gas at tips thereof.

20. A manufacturing method for wiring according to claim 17, wherein the plasma generating means has first and second electrodes, gas supplying means that introduces a gas between the first and the second electrodes, and a power supply that applies a voltage to the first or the second electrodes.

21. A manufacturing method for wiring, comprising:

forming a first conductive layer and a second conductive layer over a substrate having a dielectric surface in a selective manner with a CVD method, an evaporation method, or a sputtering method;

discharging a compound from a nozzle to selectively form a first resist layer over the first conductive layer and to selectively form a second resist layer over the second conductive layer wherein the first resist layer comprises a first resist mask selectively provided over the first conductive layer and wherein the second resist layer comprises a second resist mask selectively provided over the second conductive layer;

scanning the nozzle during the discharging of the compound;

etching the first conductive layer and the second conductive layer with plasma generating means using the first resist mask and the second resist mask under an atmospheric pressure or a pressure close to the atmospheric pressure; and ashing the first resist mask and the second resist mask with the plasma generating means under the atmospheric pressure or a pressure close to the atmospheric pressure.

22. A manufacturing method for wiring according to claim 21, wherein the first conductive layer and the second conductive layer are formed using a metal mask in a selective manner.

23. A manufacturing method for wiring according to claim 21, wherein the plasma generating means has first and second electrodes, and the first electrode surrounds the periphery of the second electrode and has a cylindrical shape having a nozzle-like supply port for to gas at tips thereof.

24. A manufacturing method for wiring according to claim 21, wherein the plasma generating means has first and second electrodes, gas supplying means that introduces a gas between the first and the second electrodes, and a power supply that applies a voltage to the first or the second electrodes.

* * * * *